(12) United States Patent
Moslehi

(10) Patent No.: US 6,907,924 B2
(45) Date of Patent: *Jun. 21, 2005

(54) THERMALLY CONDUCTIVE CHUCK FOR VACUUM PROCESSOR

(75) Inventor: Mehrdad M. Moslehi, Los Altos, CA (US)

(73) Assignee: Veeco Rochester Inc., Woodbury, NY (US)

( * ) Notice: Subject to any disclaimer, the term of this patent is extended or adjusted under 35 U.S.C. 154(b) by 51 days.

This patent is subject to a terminal disclaimer.

(21) Appl. No.: 10/271,015

(22) Filed: Oct. 15, 2002

(65) Prior Publication Data

US 2003/0029610 A1 Feb. 13, 2003

Related U.S. Application Data

(63) Continuation of application No. 08/975,626, filed on Nov. 21, 1997, now abandoned, which is a continuation-in-part of application No. 08/934,287, filed on Sep. 19, 1997, now Pat. No. 5,936,829.
(60) Provisional application No. 60/035,734, filed on Jan. 2, 1997.

(51) Int. Cl.$^7$ ............................................. H01L 21/00
(52) U.S. Cl. ..................... 165/275; 165/80.1; 165/80.4; 165/80.5; 156/345.27; 156/345.52; 156/345.53; 118/724; 118/725; 204/298.09
(58) Field of Search ................................ 165/275, 80.1, 165/80.2, 80.3, 80.4, 80.5; 156/345.27, 345.52, 345.53; 118/724, 725; 204/298.09

(56) References Cited

U.S. PATENT DOCUMENTS

| 4,194,233 A | 3/1980 | Jones et al. ................. 361/233 |
| 4,603,466 A | 8/1986 | Morley ......................... 29/569 |
| 4,615,755 A | 10/1986 | Tracy et al. ................. 156/345 |
| 4,680,061 A | 7/1987 | Lamont, Jr. ................. 148/1.5 |
| 4,743,570 A | 5/1988 | Lamont, Jr. ................. 437/248 |
| 4,909,314 A | 3/1990 | Lamont, Jr. ................. 165/80.3 |
| 4,949,783 A | 8/1990 | Lakios et al. .............. 165/80.1 |

(Continued)

FOREIGN PATENT DOCUMENTS

| JP | 1241735 | 10/1989 |
| JP | 1251735 | 10/1989 |
| JP | 6-267901 | 10/1994 |
| JP | 7-86382 | 3/1995 |
| JP | 6-267902 | 9/1996 |
| WO | WO 97/23898 | 12/1996 |

Primary Examiner—John K. Ford
(74) Attorney, Agent, or Firm—Thomas B. Ryan; Brian B. Shaw, Esq.; Harter, Secrest & Emery LLP

(57) ABSTRACT

A chuck body mounts a substrate within a vacuum chamber. Contiguous portions of the substrate and the chuck body form a heat-transfer interface. An intermediate sealing structure seals the chuck body to the substrate independently of any contact between the chuck body and the substrate and forms a separately pressurizable region within the vacuum chamber. A control system promotes flows of fluid through a periphery of the heat-transfer interface within the separately pressurizable region for controlling fluid pressures and related transfers of heat at the heat-transfer interface according to an overall aim of regulating the substrate temperature.

3 Claims, 20 Drawing Sheets

U.S. PATENT DOCUMENTS

| | | | |
|---|---|---|---|
| 4,971,653 A | 11/1990 | Powell et al. | 156/626 |
| 5,096,536 A * | 3/1992 | Cathey, Jr. | 118/724 X |
| 5,103,367 A | 4/1992 | Horowitz et al. | 361/234 |
| 5,177,878 A | 1/1993 | Visser | 34/92 |
| 5,180,000 A | 1/1993 | Wagner et al. | 165/80.1 |
| 5,192,849 A | 3/1993 | Moslehi | 219/121.43 |
| 5,213,650 A | 5/1993 | Wang et al. | 156/245 |
| 5,244,820 A | 9/1993 | Kamata et al. | 437/20 |
| 5,267,607 A | 12/1993 | Wada | 165/80.1 |
| 5,300,175 A | 4/1994 | Gardner et al. | 156/285 |
| 5,320,982 A | 6/1994 | Tsubone et al. | 437/228 |
| 5,325,261 A | 6/1994 | Horowitz | 361/234 |
| 5,326,725 A | 7/1994 | Sherstinsky et al. | 437/225 |
| 5,343,012 A * | 8/1994 | Hardy et al. | 118/725 |
| 5,382,311 A | 1/1995 | Ishikawa et al. | 156/345 |
| 5,383,971 A | 1/1995 | Selbrede | 118/728 |
| 5,421,401 A | 6/1995 | Sherstinsky et al. | 165/80.2 |
| 5,452,177 A | 9/1995 | Frutiger | 361/234 |
| 5,474,614 A | 12/1995 | Robbins | 361/234 |
| 5,547,539 A | 8/1996 | Arasawa et al. | 156/626.1 |
| 5,567,267 A | 10/1996 | Kazama et al. | 156/345 |
| 5,622,593 A | 4/1997 | Arasawa et al. | 156/626.1 |
| 5,636,098 A | 6/1997 | Salfeder et al. | 361/234 |
| 5,660,699 A * | 8/1997 | Saito et al. | 269/21 X |
| 5,697,427 A | 12/1997 | Ngan et al. | 165/80.1 |
| 5,720,818 A | 2/1998 | Donde et al. | 118/500 |
| 5,730,804 A | 3/1998 | Gomi et al. | 118/726 |
| 5,738,751 A * | 4/1998 | Camerson | 156/345 |
| 5,739,067 A | 4/1998 | DeBusk et al. | 438/618 |
| 5,740,009 A | 4/1998 | Pu et al. | 361/234 |
| 5,748,435 A | 5/1998 | Parkhe | 361/234 |
| 5,775,416 A | 7/1998 | Heimanson et al. | 165/275 |
| 5,804,089 A | 9/1998 | Suzuki et al. | 216/71 |
| 5,805,408 A | 9/1998 | Maraschin et al. | 361/234 |
| 5,861,061 A | 1/1999 | Hayes et al. | 118/52 |
| 5,936,829 A | 8/1999 | Moslehi | 361/234 |
| 5,950,723 A | 9/1999 | Heimanson et al. | 165/275 |
| 6,138,745 A | 10/2000 | Moslehi | 165/80.1 |
| 6,378,600 B1 | 4/2002 | Moslehi | |

* cited by examiner

THERMALLY CONDUCTIVE CHUCK FOR VACUUM PROCESSOR

RELATED APPLICATIONS

This application is a Continuation of application Ser. No. 08/975,626, now abandoned, originally filed 21 Nov. 1997, by Mehrdad M. Moslehi, entitled THERMALLY CONDUCTIVE CHUCK FOR VACUUM PROCESSOR, which is a Continuation-In-Part of grandparent application Ser. No. 08/934,287, by the same inventor and with the same title, filed on 19 Sep. 1997, now U.S. Pat. No. 5,936,829, issued 10 Aug. 1999, and also claims the benefit of U.S. Provisional Application No. 60/035,734, filed on 2 Jan. 1997, by the same inventor and with the same title. All prior applications are incorporated by reference.

TECHNICAL FIELD

The invention relates to the active heating or cooling of substrates in vacuum processing environments using thermally conductive chucks for transferring heat to or from the substrates. These chucks can be used in support of various vacuum processing operations such as physical-vapor deposition (PVD) and chemical-vapor deposition (CVD).

BACKGROUND

Vacuum processing operations take place in vacuum chambers that include chucks for supporting substrates in near vacuum or other low-pressure environments. Some such chucks merely provide a substrate support platform and rely on gravity to hold the substrates in place. Others actively secure the substrates with either mechanical or electrostatic clamps.

Some such chucks are also involved with the processing of the substrates by producing electrical or magnetic fields or by regulating heat transfers to or from the substrates. In plasma-assisted processes, electrical fields (e.g., chuck RF bias) direct or distribute plasma and related plasma ions impinging on the substrate. In data-storage device applications, magnetic fields can be used to magnetically orient films during their deposition onto substrates or during their subsequent thermal annealing. Heat transfers are used to remove excess heat produced by such processing operations or to provide a controlled amount of heating to assist the processing of the substrates. For example, some operations are best performed at constant substrate temperatures or at substrate temperatures that are adjusted throughout different stages of the operations.

During operations like thermal depositions (e.g., CVD) and annealing, elevated temperatures actually accomplish the substrate processing. For instance, heat-generating chucks for controlling substrate temperatures (e.g., up to 450° C.) are required for PVD reflow depositions of aluminum (Al) or copper (Cu) interconnect materials. Metal-organic chemical-vapor deposition (MOCVD) processes for depositing semiconductor interconnect materials (e.g., Al or Cu) or barrier materials (e.g., TiN or TaN) also require heat-generating chucks for controlling substrate temperatures (e.g., up to 350° C.).

However, controlling substrate temperatures in near vacuum or other low-pressure environments is quite difficult because heat does not transfer well at pressures approaching a vacuum. For example, the conduction of heat between contiguous surfaces of a chuck body and the substrate is slow and inefficient because actual contact on an atomic scale between the surfaces is limited to a small fraction of their common area, and gaps that separate the remaining areas of their surfaces are sufficient to prevent effective heat transfer by conduction.

Heating and cooling of substrates through radiational heat transfers are possible in a vacuum environment, particularly at elevated substrate and chuck temperatures; but radiational heat transfers are generally too slow to maintain substrates at desired processing temperatures. This is particularly true for most chuck-based fabrication processes with substrate temperatures below 450° C. Faster transfers are possible by pumping a gas, preferably an inert gas such as helium or argon or another gas such as nitrogen, between the chuck body and the substrate. Although still at much less than atmospheric pressure, the gas sufficiently fills the small gaps between the chuck body and the substrate to support significant heat transfer through thermal conduction between them. A seal formed between the mounting surface of the chuck body and the substrate resists significant leakage of the gas into the rest of processing chamber.

U.S. Pat. No. 4,680,061 to Lamont, Jr. discloses chucks having heating or cooling elements for regulating substrate temperatures. One of the chucks has a ceramic heating element mounted in a cavity between a chuck body and a substrate. The heating element is mounted close to a back side of the substrate but not in contact. Argon gas is introduced into the cavity to promote heat exchanges between the heating element and the substrate. A raised rim of the chuck body on which the substrate is mounted contacts a peripheral portion of the substrate's back side forming a seal that inhibits leakage of the gas out of the cavity.

Another of Lamont, Jr.'s chucks has a chuck body that functions as a heat sink with coolant channels for conveying heat from the sink. A similar cavity is formed by a raised rim in the chuck body so that the remaining heat sink is positioned close but not in contact with the back side of a substrate. Argon gas is similarly trapped within the cavity by contact between the raised rim of the chuck and the back side of the substrate.

U.S. Pat. No. 4,949,783 to Lakios et al. also discloses a chuck using gas pressure against a back side of a substrate to promote substrate cooling. A similar cavity is formed in the chuck body and surrounded by a raised rim for contacting the back side of the substrate. However, instead of merely pumping gas into the cavity, Lakios et al. circulate the gas both into and out of the cavity by establishing a gas flow. Part of the heat transfer from the substrate is due to gas-conducted heat exchanges with the chuck body, and another part of the heat transfer is due to the removal of heated gas from the cavity.

The chucks of both Lamont, Jr. and Lakios et al. include raised rims on their chuck bodies that function as both mounting surfaces and seals. Mechanical clamps press the substrates against the raised rims of their chuck bodies to tighten the seals and to reduce leakage of back side gas into their processing chambers. Lakios et al. also use an O-ring seal next to their raised rim to provide an even tighter seal for further reducing leakage.

SUMMARY OF INVENTION

This invention in one or more of its embodiments improves substrate chucks that use gas as a medium for transferring heat to or from substrates in a vacuum processor by at least partially separating the function of mounting a substrate on a chuck body from the function of sealing a contiguous space between them. The substrate can be mounted directly against the top surface of the chuck body, which is either heated or cooled, for providing a large heat-transfer interface; and a separate sealing structure can be used to seal the chuck body to the substrate beyond the immediate interface between the chuck body and the substrate.

The sealing structure confines the gas, which is referred to as a "backside" or "heat-transfer" gas, within a space that includes the interface between the chuck body and the substrate but also extends beyond the interface to permit free exchanges or direct flows of gas through at least a portion of the interface periphery. Conduits can be connected to the interface and the space beyond the interface to promote uninhibited flows of the backside gas to or from the interface. Channels formed in a mounting surface of the chuck body contiguous with the substrate can be used to ensure uninhibited gas flows within the interface.

Thus, instead of inhibiting flows through a sealed periphery of a heat-transfer interface as practiced in the prior art, a free flow of the backside gas through the interface is permitted and preferably promoted. This invention in one or more of its embodiments also replaces a seal on which the substrate is mounted with a sealing structure separate from a mounting surface of the chuck body so the functions of substrate mounting and sealing can be separately optimized for the benefit of each function as well as for enhancing transfers of heat between the chuck body and the substrate. In addition, this invention can be used to minimize the amount of backside gas leakage into the vacuum chamber, while allowing uninhibited backside gas flow through the substrate/chuck periphery.

An embodiment of the new thermally conductive chuck includes a temperature regulator, such as a heater or cooler, in thermal communication with a chuck body. A mounting surface of the chuck body supports a substrate (e.g., a semiconductor wafer or a data storage thin-film head substrate) within an evacuated space of a processing chamber and forms together with the substrate a heat-transfer interface between them. An intermediate sealing structure seals the chuck body to the substrate beyond the heat-transfer interface for confining gas within an isolated portion of the evacuated space that permits free exchanges of the gas through a periphery of the interface without allowing significant leakage of the gas into a processing region of the processing chamber.

The isolated portion of the evacuated space is a separately pressurizable region of the processing chamber and can have a gas pressure different from (e.g., higher than) the gas pressure in the remaining regions of the processing chamber. The heat-transfer interface between a back side of the substrate and the mounting surface of the chuck body forms a first part of the separately pressurizable region; and a chamber (e.g., a gas cavity) bounded by the intermediate sealing structure, the chuck body, and the substrate forms a second part of the separately pressurizable region. The free exchanges of gas, preferably based on a directed gas flow, pass between the first and second parts of the region.

The intermediate sealing structure, which can take varied forms, preferably isolates the separately pressurizable region from the rest of the evacuated space of the processing chamber independently of any contact between the temperature-regulated portion of the chuck body and the substrate. In contrast, the mounting surface within the separately pressurizable region preferably contacts a central portion of the substrate for enhancing thermal transfers between the chuck body and the substrate. Channels formed in a flat area of the mounting surface promote a free flow of gas within the heat-transfer interface. The channels are preferably arranged in a pattern including a combination of radial and circular or square grooves corresponding to the substrate shape. Some of the channels preferably extend through the periphery of the heat-transfer interface to support the free flows of gas between the two parts of the separately pressurizable region (i.e., between the heat-transfer interface and the immediately surrounding chamber).

At least one conduit is connected to the separately pressurizable region to control gas pressures within the region, particularly at the heat-transfer interface. Preferably, separate inlet and outlet conduits are connected to the two parts of the separately pressurizable region for directing flows between the two parts. For example, the inlet conduit can be connected to the surrounding chamber for supplying gas to the periphery of the heat-transfer interface, and the outlet conduit can be connected to the heat-transfer interface for exhausting the gas flowing into and through the heat-transfer interface. A control system regulates the flow rates and gas pressures throughout the separately pressurizable region.

The intermediate sealing structure preferably includes a portion of a first seal joining the intermediate sealing structure to the substrate and a portion of a second seal joining the intermediate sealing structure to a portion of the chuck body beyond the heat-transfer interface (e.g., an extended portion of the chuck body including the chuck housing). The first seal can be positioned for engaging either a front surface of the substrate, which is otherwise exposed to process gas pressure in the processing chamber, or a back surface of the substrate, which is otherwise exposed to higher gas pressure within the separately pressurizable region. The second seal can join the intermediate sealing structure either directly to a heat-conducting portion of the chuck body or indirectly through a thermal insulator, an extended portion of the chuck body not used for similar heat transfers or substrate support, or a wall of the vacuum processing chamber. The intermediate structure itself can also be made from a thermal insulating material such as a ceramic or resin material to thermally isolate the intermediate structure from the heat-conducting portion of the chuck body.

Since the intermediate sealing structure is interposed (directly or indirectly) between the heat-conducting portion of the chuck and the first seal, more options are available for regulating temperatures at the first seal. For example, using thermal insulating materials, the intermediate sealing structure can function as a thermal insulator during heating operations to reduce substrate temperature disturbances at the first seal. However, the intermediate sealing structure can also function as a conductor during cooling operations. The area of the intermediate sealing structure exposed to gas within the separately pressurizable region and the proximity of the intermediate sealing structure to the heat-conducting portion of the chuck body are other design variables that can be used to regulate thermal conduction of the intermediate sealing structure.

One example of such an intermediate sealing structure is a modified mechanical clamp that otherwise functions to press the substrate against the mounting surface of the chuck body. A first sealing surface of the clamp engages the front surface of the substrate around its entire periphery, and a second sealing surface of the clamp engages the chuck body or an extended region of the chuck body. Preferably, one of the sealing surfaces is mounted from a flexible portion of the clamp or engages a flexible sealing surface of the chuck body to accommodate slight variations in substrate thickness or dimensional tolerances of the chuck.

The intermediate sealing structure can also be formed by a peripheral support surrounding the mounting surface of the chuck body. A first sealing surface of the peripheral support engages the back surface of the substrate in a position beyond the heat-transfer interface. A second sealing surface joins the peripheral support to the chuck body. In this arrangement, the mounting surface can be built up from alternating layers of electrically conductive and non-conductive films to form an electrostatic clamp for pressing (fixing) the substrate against both the mounting surface and the peripheral support.

DRAWINGS

DETAILED DESCRIPTION

Figure 1:
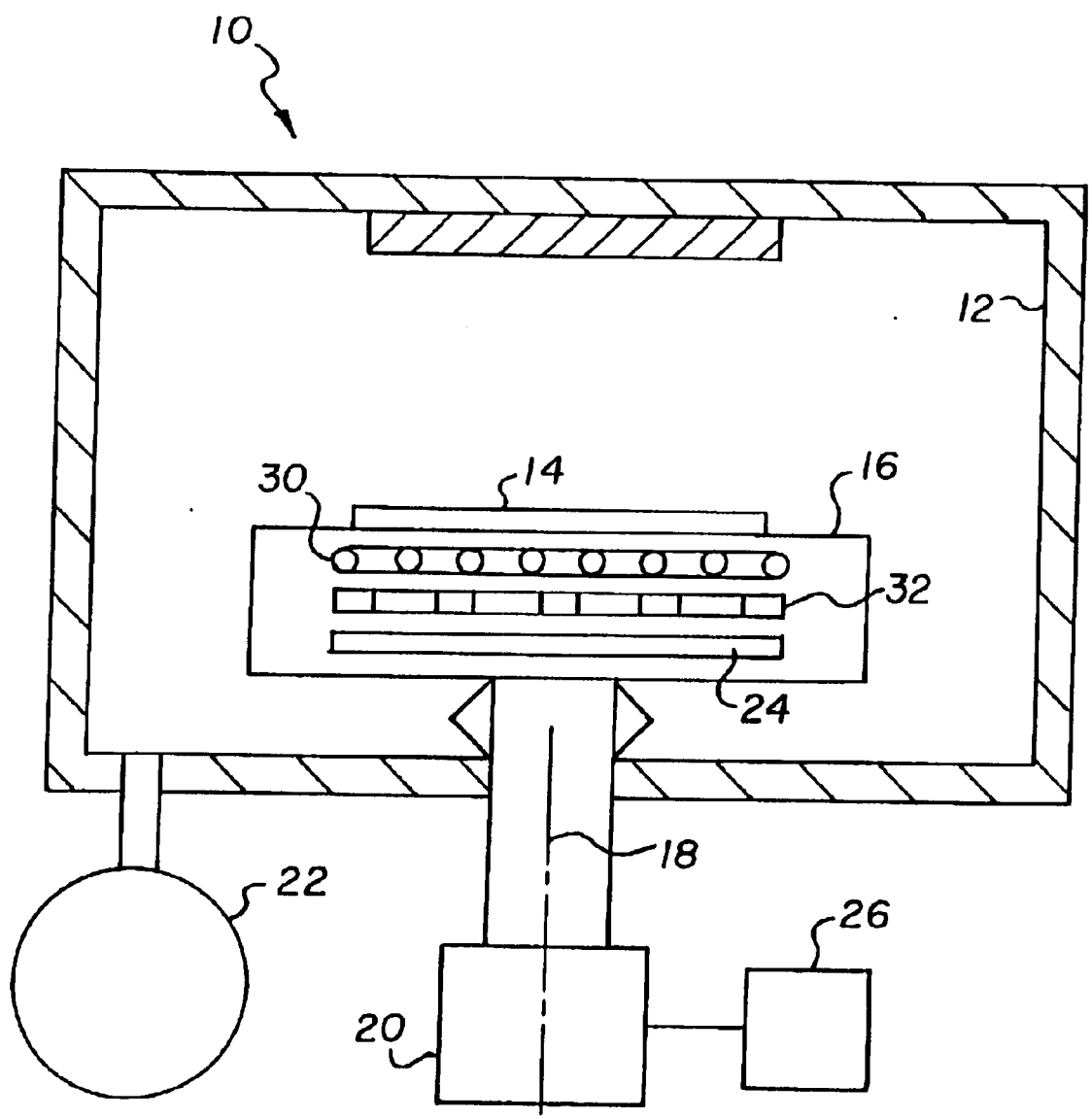
FIG. 1 is a schematic cross-sectional view of a vacuum processing chamber in which a substrate is mounted on a chuck that is adjustable in height within the processing chamber.

A vacuum processor 10, which is depicted schematically in FIG. 1, includes a vacuum processing chamber 12 for processing a substrate 14. A chuck 16 supports the substrate 14 within the vacuum processing chamber 12 in adjustable-height positions that can be varied along a reference axis 18. A drive mechanism 20 moves the chuck 16 together with the substrate 14 along the reference axis 18 for positioning the substrate 14 within the processing chamber 12.

A pump 22 evacuates the processing chamber 12 for supporting operations that are best performed in a near vacuum or other low-pressure environment. For example, the vacuum processor 10 is intended for operations such as physical vapor deposition (PVD), including ion-beam deposition and plasma-assisted sputtering, chemical vapor deposition (CVD), metal-organic chemical vapor deposition (MOCVD), and plasma-enhanced chemical vapor deposition (PECVD)—all of which deposit material layers on the substrate 14. Other exemplary treatment operations affecting the substrate or the deposited materials include thermal planarization, annealing, plasma etching, and substrate cleaning.

Various electrical and magnetic fields can be used for initiating or controlling the substrate processing operations. In the vicinity of the substrate 14, a magnetic field can be used for orienting magnetic materials that are deposited on the substrate (e.g., magnetic data storage thin-film head substrate), and an electrical bias (DC or RF) can be used for enhancing or otherwise regulating the impact of ions on the substrate 14. Polarities of the various electrical or magnetic fields can also be varied to further influence operations. For example, the chuck 16 contains a plate-shaped electromagnet 24 for supporting substrate processing operations requiring a magnetic field in the vicinity of the substrate 14 for in-situ magnetic orientation and is also connected to an RF generator 26 for supporting processing operations requiring an electrical bias.

Also within the chuck 16 are two temperature regulators, namely, a heating element 30 and a cooling element 32. The heating element 30 enables operations requiring controlled substrate heating at elevated substrate temperatures, and the cooling element 32 supports operations requiring withdrawal of excess heat from the substrate 14 or the chuck 16. Together, the heating and cooling elements 30 and 32 can optimize substrate temperatures and facilitate precise substrate temperature control throughout various stages of processing that are best performed at particular temperatures or rates of temperature change. Further details of a chuck containing both heating and cooling elements is disclosed in co-assigned U.S. application Ser. No. 08/560,344, filed Nov. 17, 1995. This application is hereby incorporated by reference.

This invention, which relates to transfers of heat between the substrate 14 and the chuck 16 for the purpose of substrate heating or cooling, can be practiced with different combinations of these components for supporting particular processing operations. For example, only the heating element 30 or only the cooling element 32 can be incorporated into the chuck 16 to support operations requiring either heating or cooling. In fact, the chuck 16 itself could be used as a heat sink independent of any other temperature regulator.

Figure 2:
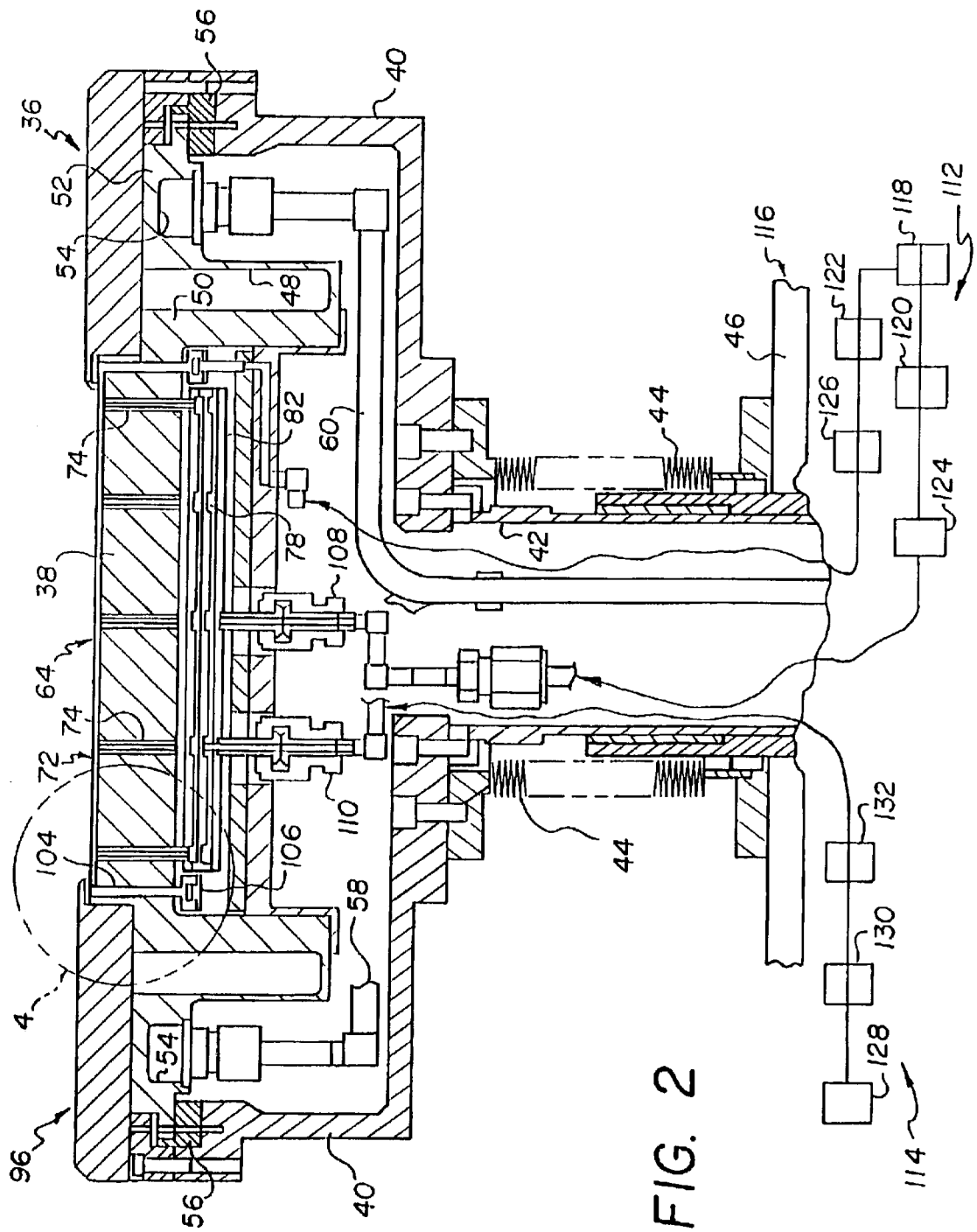
FIG. 2 is a more detailed cross-sectional view of an exemplary chuck having means for supporting an uninhibited flow of gas through a periphery of a substrate-chuck interface. Only a small broken away portion of the processing chamber is shown, and gas flow controls are depicted schematically.
Figure 3:
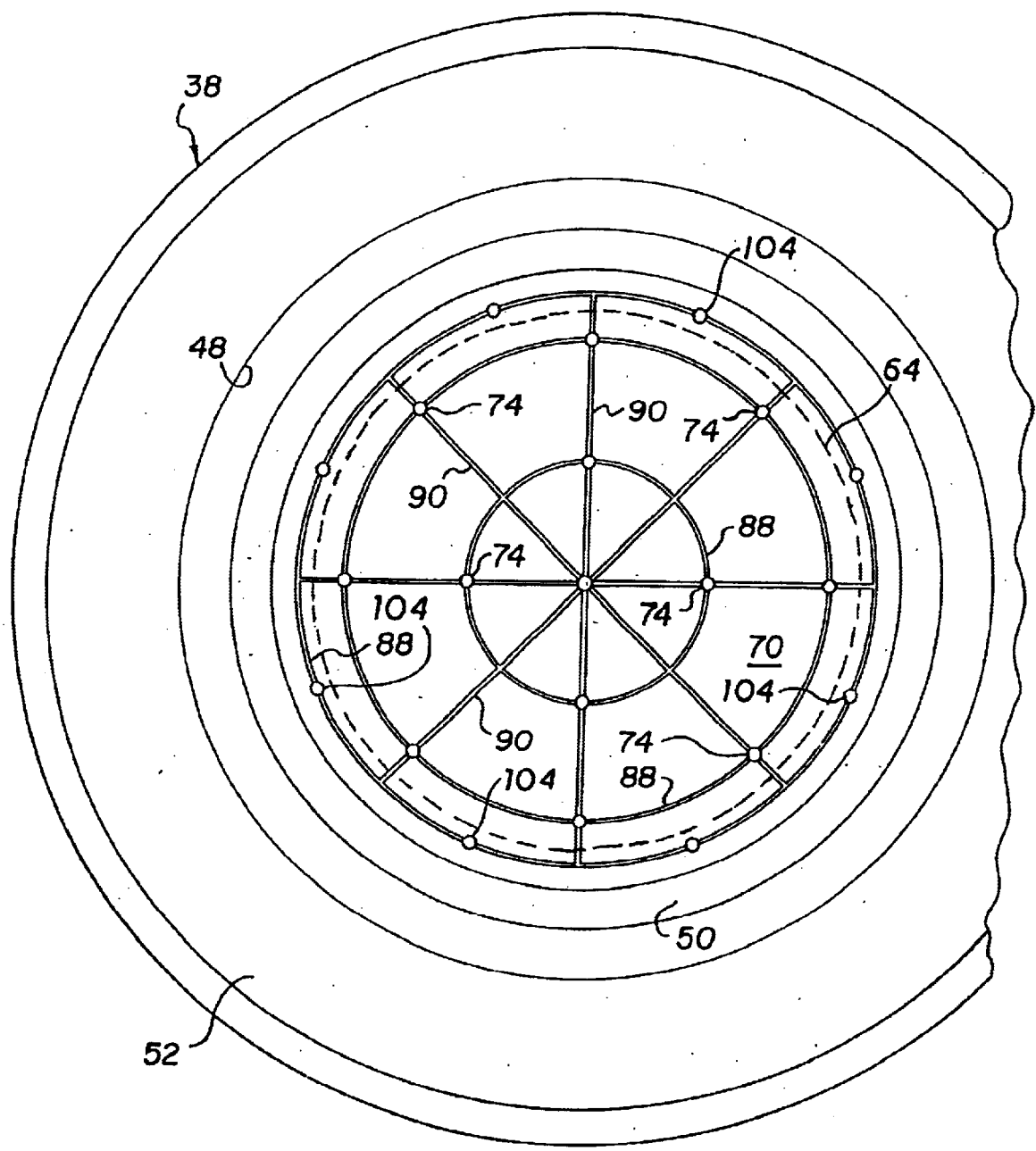
FIG. 3 is a top view of the chuck shown in FIG. 2 with a mechanical clamp and the substrate removed to show underlying features, including channels formed in a chuck mounting surface to enable free flows of gas through the periphery of the substrate-chuck interface.
Figure 4:
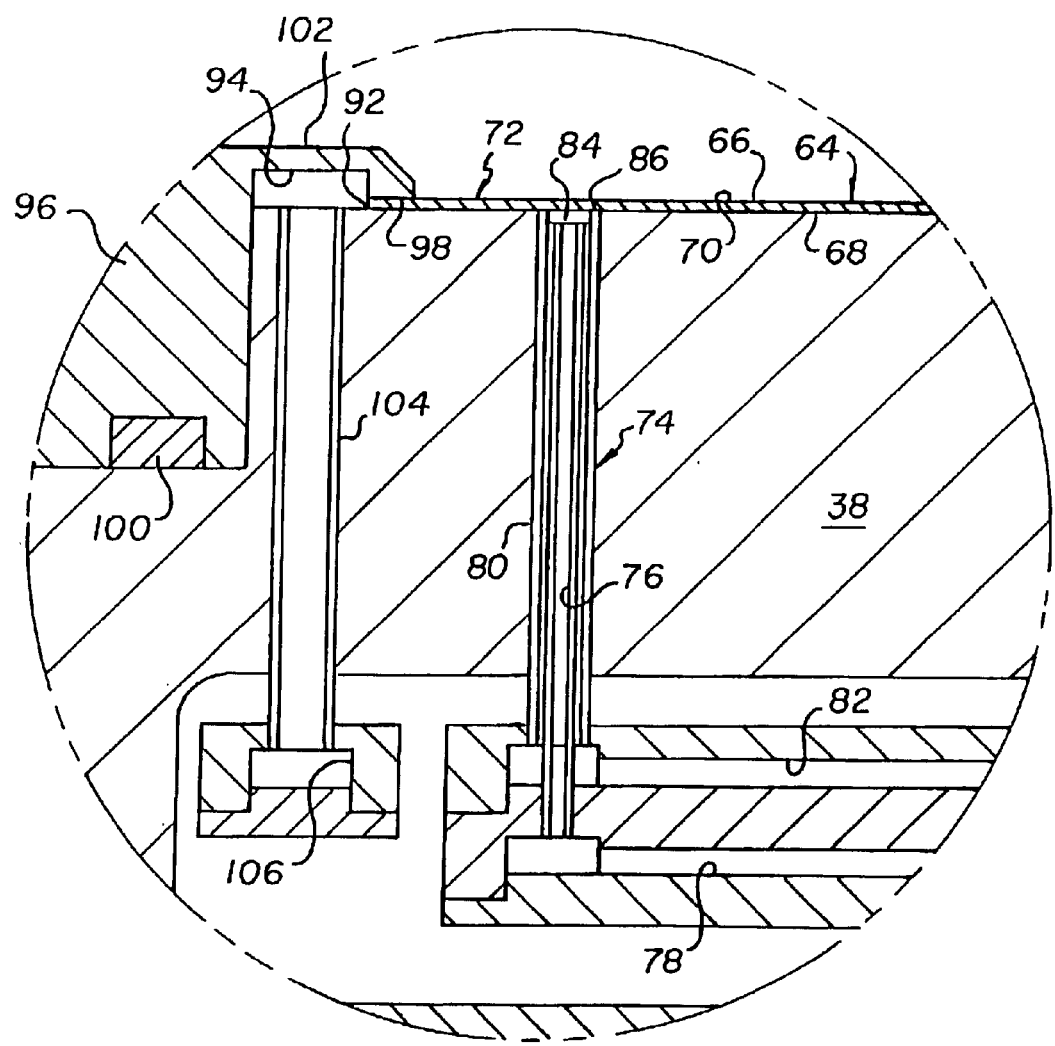
FIG. 4 is an enlarged partial view of FIG. 2 showing a region of engagement between the mechanical clamp, the substrate, and the chuck body as well as gas inlet and outlet conduits that are positioned to promote flows of gas through the periphery of the substrate-chuck interface.

More detailed views of an exemplary chuck 36 for carrying out this invention are shown in FIGS. 2–4. The chuck 36 has a chuck body 38, including a chuck housing 40 and a support and utilities feed-through column 42. Bellows 44 surround the support column 42 of the chuck body 38 for sealing the housing 40 of the chuck body 38 to a bottom plate of a processing chamber 46, which is only partially shown.

Within the chuck body 38 (made of metal or a metallic alloy), a thin-walled trough 48 thermally separates inner and outer portions 50 and 52 of the chuck body 38. The thin-walled trough 48 minimizes heat transfer or heat loss from the inner portion 50 of the chuck body 38 to the outer portion 52 of the chuck body 38. An annular coolant passage 54 lowers temperatures of the outer portion 52 of the chuck body 38 for protecting a seal 56 between the outer portion 52 of the chuck body 38 and the housing 40 of the chuck body 38, particularly during substrate heating operations. Conduits 58 and 60 carry coolant, such as cooling water, to and from the annular passage 54 within a conventional coolant circulatory system, the rest of which is not shown.

A substrate 64, such as a silicon wafer or a thin-film head substrate, having a front surface 66 and a back surface 68 is supported in contact or in proximity with a mounting surface 70 of the chuck body 38, forming between them an interface 72 through which heat can be transferred between the chuck body 38 and the substrate 64. The mounting surface 70 is substantially flat, matching the shape of the back surface 68 of the substrate 64 for minimizing any space separating the two surfaces 68 and 70. The mounting surface 70 can also have a small global curvature for improved substrate-to-chuck contact upon clamping.

An array of concentric conduits 74 conveys an uninhibited flow of gas (or other fluid) to and from the heat-transfer interface 72 for enhancing transfers of heat between the inner portion 50 of the chuck body 38 and the substrate 64. Each of the concentric conduits 74 includes an inner conduit 76, which is connected to an inlet gas manifold 78, and an outer conduit 80, which is connected to an outlet gas manifold 82. A top end 84 of the inner conduit 76 is preferably recessed with respect to a top end 86 of the outer conduit 80 to minimize flow resistance between the two top ends 84 and 86 at the heat-transfer interface 72. One or more single-tube conduits can be used instead of the array of concentric conduits 74 anywhere throughout the inner portion 50 of the chuck body 38 under the substrate 64 (e.g., at the center of the chuck body).

A plurality of circumferential and radial channels 88 and 90 formed in the mounting surface 70 supports flows of heat-transfer gas throughout the heat-transfer interface 72. The circumferential and radial channels 88 and 90 intersect each other and the concentric conduits 74. The radial channels 90 also extend through a periphery 92 of the heat-transfer interface 72 into an annular chamber 94 (or manifold) bounded by a mechanical clamp 96, the chuck body 38, and the substrate 64.

The mechanical clamp 96, which maintains the substrate 64 against the mounting surface 70, also functions as an intermediate sealing structure for isolating the annular chamber 94 and with it the heat-transfer interface 72 from the remaining evacuatable space within the processing chamber 46 including the active processing region. A first seal 98 joins the mechanical clamp 96 to the front surface 66 of the substrate 64, and a second seal 100 joins the mechanical clamp 96 to the chuck body 38. Although shown in FIG. 4 in engagement with the inner portion 50 of the chuck body 38, the seal 100 is more preferably engaged with the outer (thermally isolated) portion of the chuck body 38. The two seals 98 and 100 are relatively adjustable in height to accommodate different mounting positions of the clamp 96 associated with thickness variations among substrates or dimensional tolerances of the chuck body 38 and clamp 96. For example, a cantilevered portion 102 of the clamp 96 can be made sufficiently flexible to provide the required height adjustment. The seals 98 and 100 themselves can also be arranged to provide such flexibility, such as by employing an oversized elastomer O-ring for the seal 100.

The annular chamber 94 and the heat-transfer interface 72 form two portions of a separately pressurizable region within the vacuum chamber 46. One or more single-tube conduits 104 connect the annular chamber 94 to a manifold 106, which can be arranged as either an input or output manifold depending on the desired direction of flow between the annular chamber 94 and the heat-transfer interface 72. As an input manifold, increased pressure in the manifold 106 directs flows into the annular chamber 94 and through the periphery 92 of the heat-transfer interface 72. The concentric conduits 76 convey a net flow from the heat-transfer interface 72. As an output manifold, reduced pressure in the manifold 106 directs a net flow through the concentric conduits 76 into the heat-transfer interface 72 and through its periphery 92 into the annular chamber 94, where it is withdrawn through the single-tube conduits 104.

Fluid (gas) couplings, such as the illustrated couplings 108 and 110 to the manifolds 78 and 82, connect each of the manifolds 78, 82, and 106 to separate groups of controls 112, 114, and 116 for regulating flows of heat-transfer gas into or out of the manifolds 78, 82, and 106. Though depicted only schematically, the controls 112 and 116 function as conventional inlet controls for regulating gas flows into the manifolds 78 and 106, and the controls 114 function as conventional outlet controls for regulating gas flows out of the manifold 82. The inlet controls 112 and 116 include, for example, a common gas supply 118 but separate mass flow control valves 120 and 122 and pressure gauges 124 and 126. The outlet controls 114 include a vacuum pump 128, a throttle (or adjustable conductance) valve 130, and a pressure gauge 132. A processor (not shown) monitors pressures sensed by the gauges 124, 132, and 126 and controls the valves 120, 130, and 122 for maintaining desired gas pressures (e.g. 1 Torr to 10 Torr) and gas flow rates (e.g., 5 sccm to 100 sccm) in and through the heat-transfer interface 72.

The heat-transfer gas, which is preferably an inert gas (such as argon, helium, or xenon) or another suitable gas (such as nitrogen, or hydrogen), is preferably flowed continuously through the heat-transfer interface 72 and annular chamber 94 so that variations in the flow rates into and out of the manifolds 78, 82, and 106 can be used to make rapid changes or adjustments in pressure throughout the heat-transfer interface 72 and the annular chamber 94. Although the gas pressures at the heat-transfer interface 72 and the annular chamber 94 are higher than those in the remaining evacuatable space of the processing chamber 46, these pressures are preferably kept to a minimum required (e.g., between 1 Torr and 10 Torr) to support the desired heat transfers between the chuck body 38 and the substrate 64 while avoiding excess gas leakage, such as more than 5 sccm, through the seals 98 and 100.

For simplicity, a temperature regulator is not shown in the drawing FIGS. 2–4. However, a heating element, a cooling element, or both heating and cooling elements can be incorporated into the chuck body 38 for regulating the temperature of the substrate 64. The mechanical clamp 96, which functions as an intermediate sealing structure, can be either thermally coupled to or thermally isolated from the chuck body 38. For substrate cooling operations, the clamp 96 can be made of a high-thermal-conductive material or a low-thermal-conductive material. Generally, sealing is more difficult at higher chuck and substrate temperatures—so the clamp 96 is preferably thermally isolated from the chuck body for heating operations. In order to minimize the heat-sinking effect of the mechanical clamp 96, a contacting portion of the clamp can be made from a thermal insulating material, such as a ceramic or resin material or other low-thermal-conductive materials.

Thermal coupling of the clamp 96 to the chuck body 38 can be enhanced in several ways including making the clamp of a high-thermal-conductive material or increasing the amount of common area in proximate contact between the chuck body 38 and the clamp 96. Thermal isolation of the clamp 96 can be accomplished conversely. For example, the clamp 96 can be made of a thermal insulating material or a low-thermal-conductive material can be used to separate the clamp 96 from contact with the chuck body 38. Similarly, the spacing between the chuck body 38 and the clamp 96 can be increased.

The configuration of the conduits 74 and 104 can also be changed for particular purposes. For example, either or both of the conduits 74 and 104 can be single tube or concentric double-tube conduits. The single conduits can be used to connect separate inlet or outlet manifolds to the heat-transfer interface 72 and the annular chamber 94 for controlling directions of gas flow through the periphery 92 of the heat-transfer interface 72.

Figure 4A:
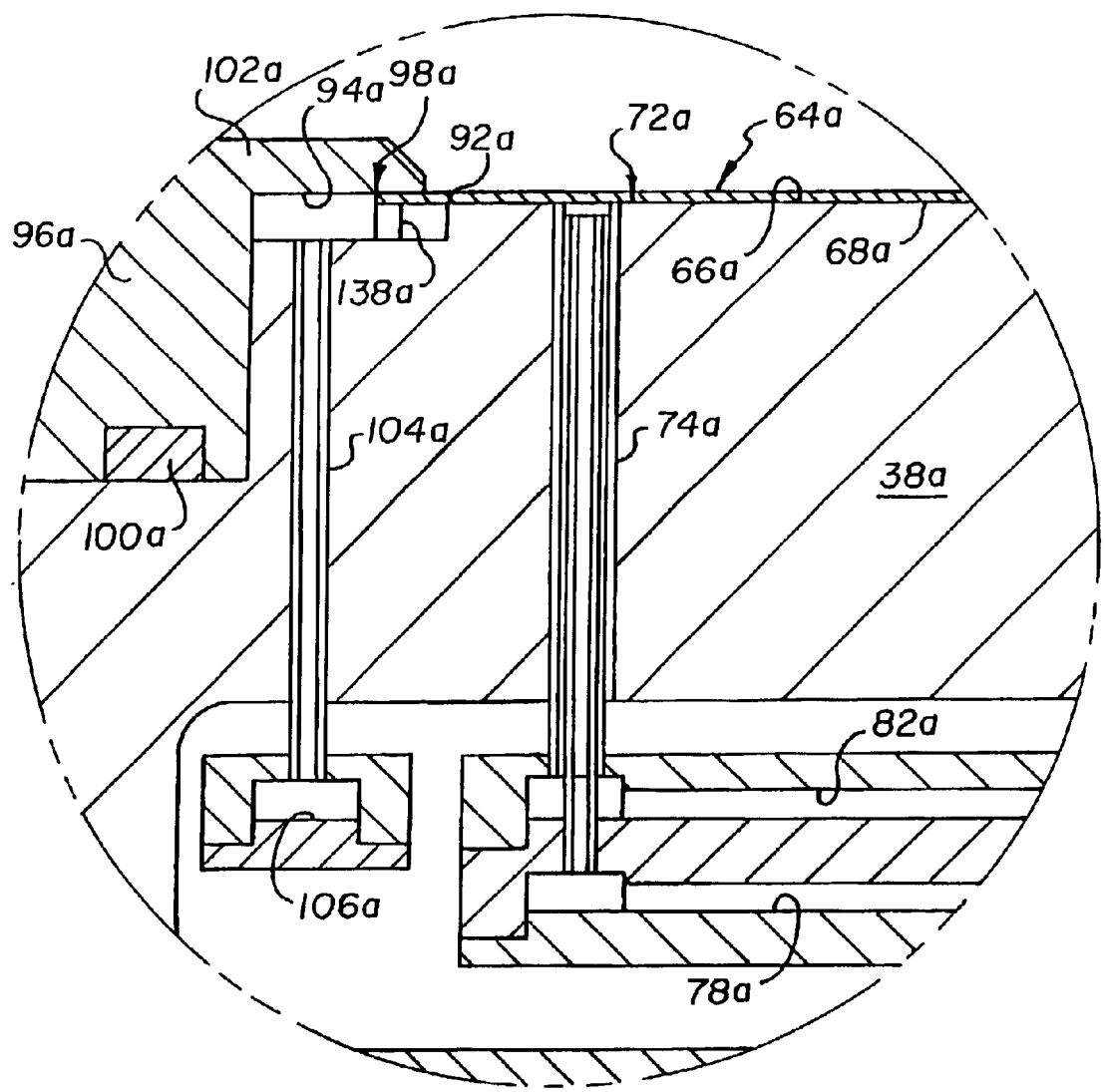
FIG. 4A is a similar partial view showing an alternative engagement region with substrate support posts (or a slotted rim) projecting from a recess in the chuck body.
Figure 4B:
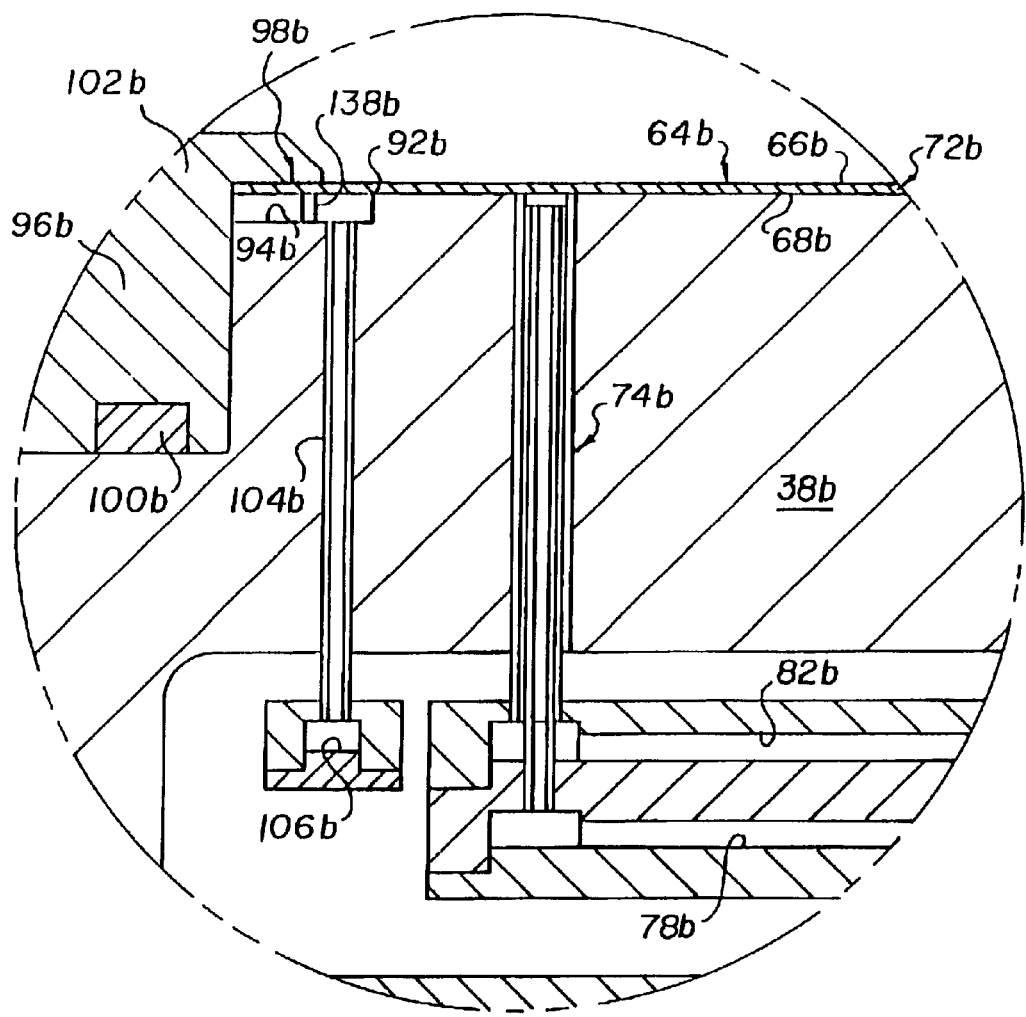
FIG. 4B is a similar partial view showing another alternative engagement region with the recess entirely beneath the substrate.

The annular chamber 94 can also be constructed in a variety of different ways as illustrated in FIGS. 4A and 4B. Corresponding structures are referenced by the same numerals but are distinguished by the letters "a" and "b" for the different embodiments. For example, alternative annular chamber 94a is formed as a recess in chuck body 38a. The annular chamber 94a extends beneath substrate 64a exposing a peripheral portion of its back surface 68a to gas within the chamber 94a. Posts 138a (which could also be formed as a slotted rim) support the overhung portions of the substrate 64a against a clamping force imparted by mechanical clamp 96a to front surface 66a of the substrate 64a.

Unlike cantilevered portion 102a of the clamp 96a, which forms a continuous first seal 98a surrounding the substrate 64a, the posts 138a are circumferentially spaced to permit free flows of gas between them. Alternative structures such as slotted rims can also be used to similarly support the substrate 64a without inhibiting flow between the periphery 92a of the heat-transfer interface 72a and conduits 106a. The posts 138a can be made from either high-thermal-conductive or low-thermal-conductive materials to suit different operations. However, the posts 138a are preferably made of the same material and integral with the chuck body 38a.

Alternative annular chamber 94b is formed entirely beneath substrate 64b. Posts 138b similarly support the overhung portion to the substrate 64b. Conduits 104b are connected to the annular chamber 94b between the posts 138b and the periphery 92b of the heat-transfer interface 72b. Although the posts 138b are not positioned to obstruct flows between the heat-transfer interface 72b and the conduits 104b, the posts 138b are still preferably spaced to permit free flows of gas between them to expose the entire back surface 68b of the substrate 64b to the gas through an uninhibited flow.

Figure 5:
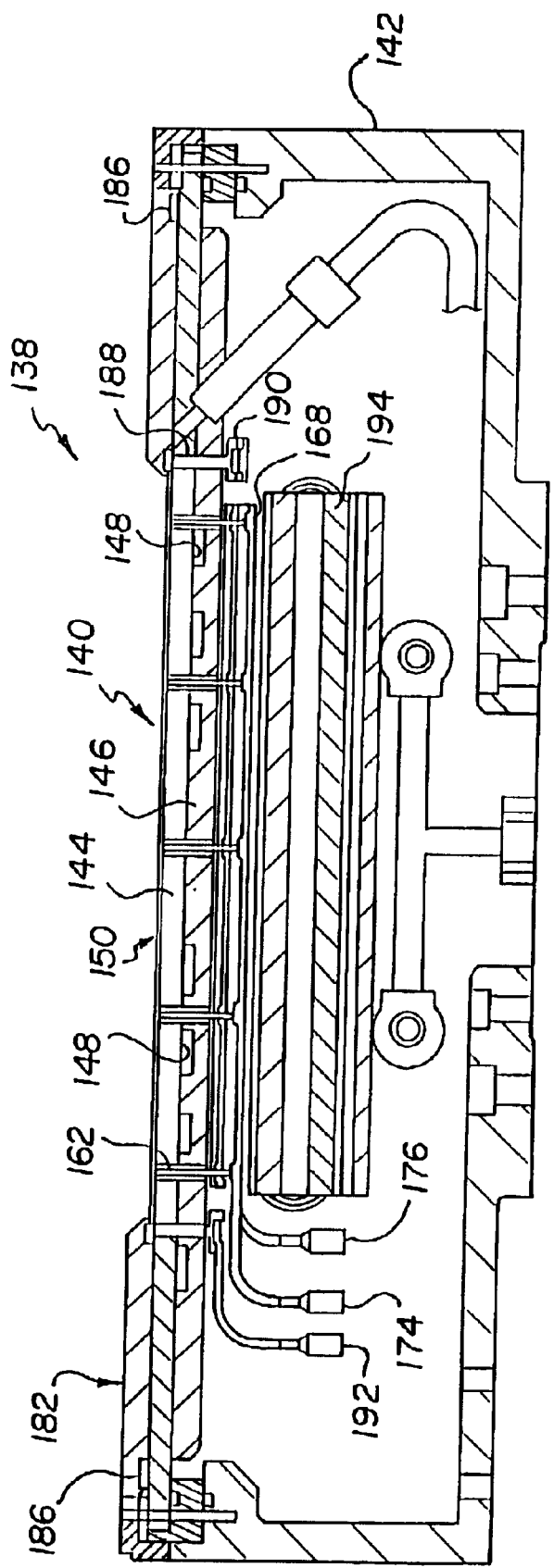
FIG. 5 is a cross-sectional view of an alternative chuck specifically arranged for cooling substrates and having an electromagnet that can be used for magnetically orienting magnetic films.
Figure 6:
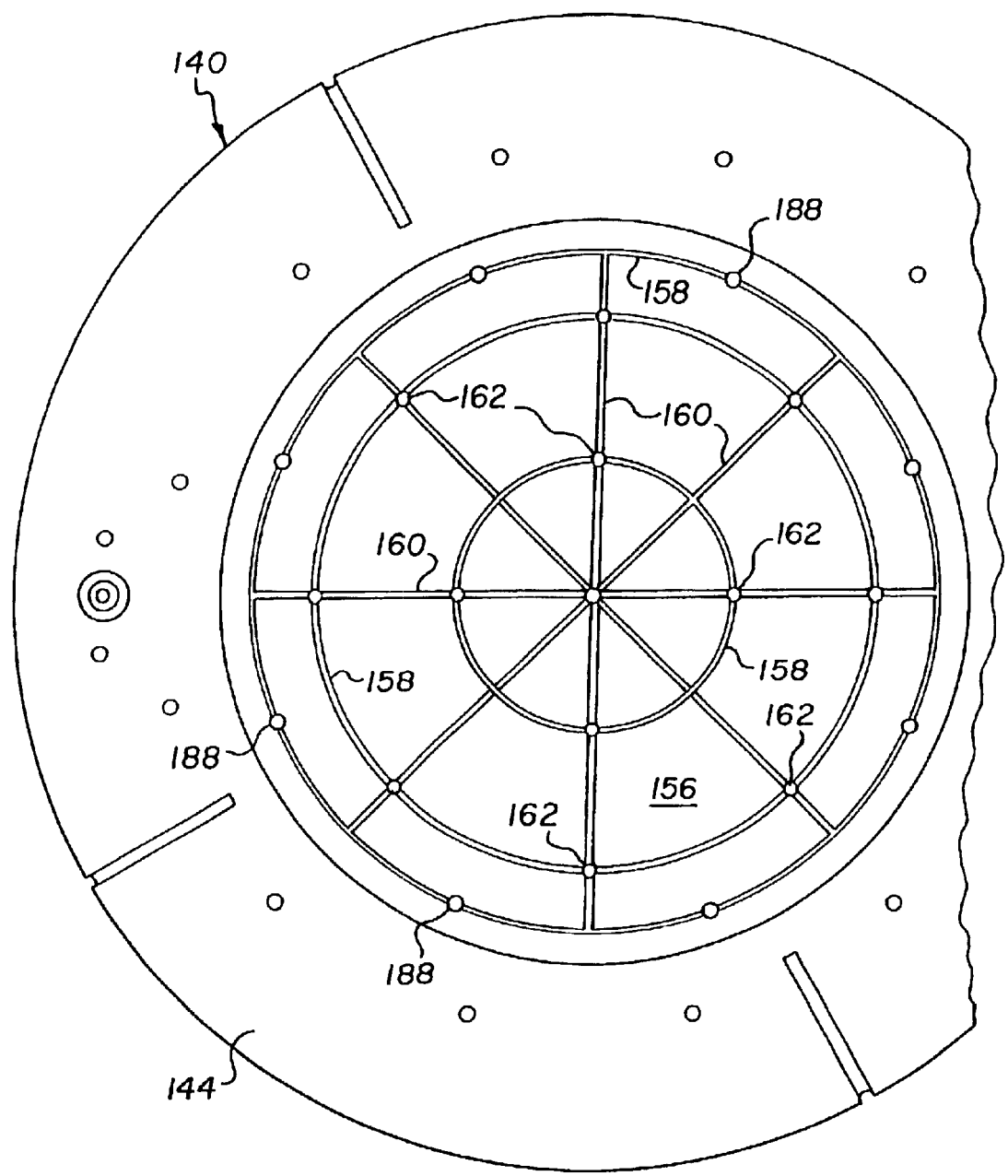
FIG. 6 is a top view of the body of the chuck shown in FIG. 5 with a mechanical clamp and the substrate removed to show underlying features including an arrangement of grooves similar to FIG. 3.
Figure 7:
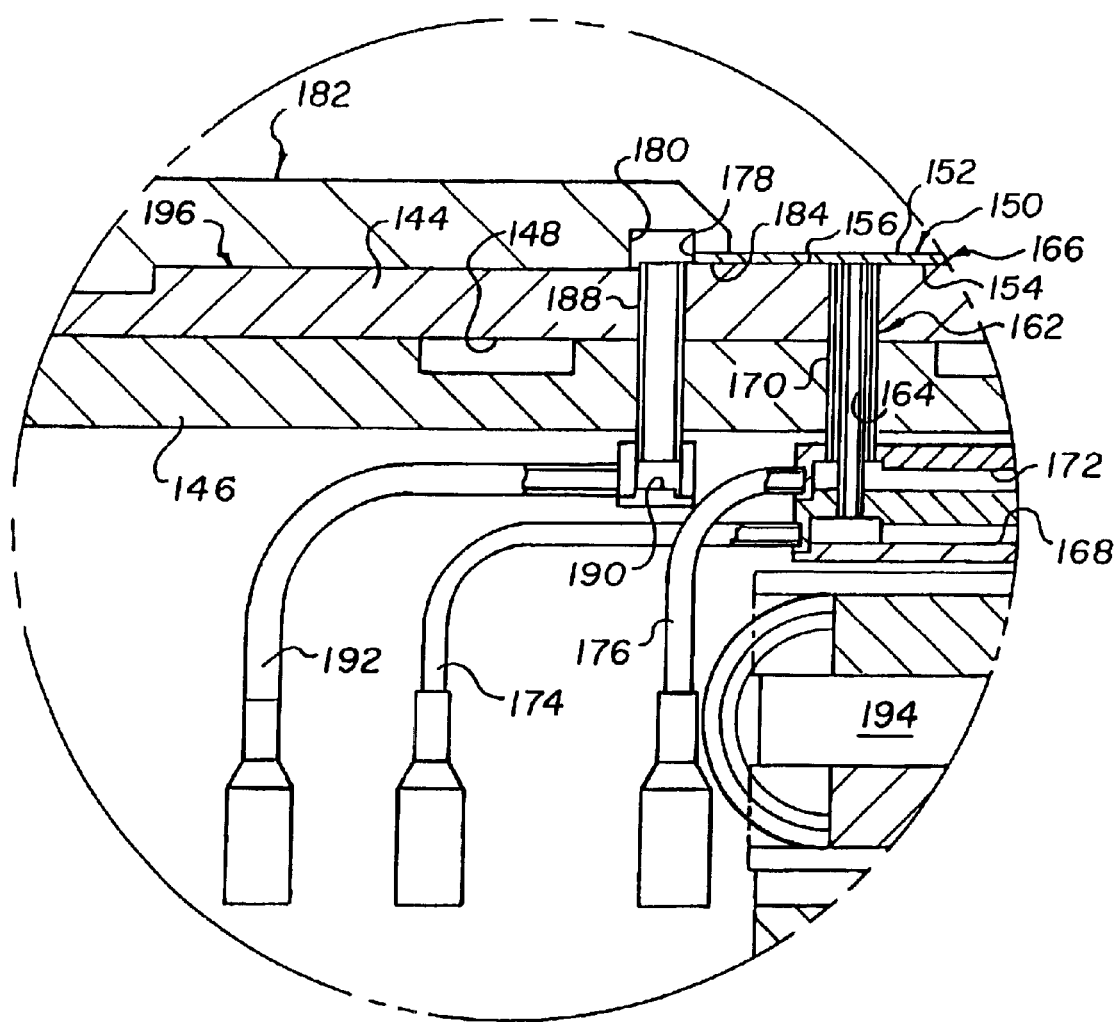
FIG. 7 is an enlarged partial view of FIG. 5 showing a region of engagement between the clamp, the substrate, and the chuck body, as well as inlet and outlet conduits for providing and collecting gas flowing through the substrate-chuck interface.

An alternative chuck 138 depicted by FIGS. 5–7 is adapted more specifically for cooling substrates. The chuck 138 has a heat-conducting body 140 and a surrounding chuck housing 142. (A support column with baffles connecting the chuck housing 142 to a processing chamber is not shown.) The heat-conducting body 140 is formed by top and bottom plates 144 and 146 connected together by a brazing process. Channels 148 formed between mating surfaces of the plates 144 and 146 circulate coolant through the chuck body 140. A conventional coolant circulating system (not shown) can be used to control the flow or temperature of coolant through the channels 148.

A substrate 150 has a front surface 152 exposed to evacuated space within a processing chamber (not shown) and a back surface 154 positioned in contact with a mounting surface 156 of the chuck body 140. Except at circumferential and radial channels 158 and 160 formed in the mounting surface 156, the back surface 154 of the substrate 150 is substantially contiguous with the mounting surface 156, forming between them a heat-transfer interface 166 for transferring heat between the chuck body 140 and the substrate 150.

Similar to the preceding embodiments, concentric conduits 162 deliver flows of gas to and from the heat-transfer interface 166. Inner conduits 164 connect the heat-transfer interface 166 to an inlet manifold 168, and outer conduits 170 connect the heat-transfer interface 166 to an outlet manifold 172. Lines 174 and 176 connect the manifolds 168 and 172 to conventional flow controls, which are not shown.

The circumferential and radial channels 158 and 160 in the mounting surface 156 assure the rapid circulation and uninhibited flow of gas throughout the heat-transfer interface 166. The radial channels 160 extend through a periphery 178 of the heat-transfer interface 166 into communication with a surrounding annular chamber 180. Most of the annular chamber 180 is formed by a recess or groove in a mechanical clamp 182, which is otherwise intended to press the substrate 150 into contact with the chuck body 140.

The mechanical clamp 182 forms a first seal 184 with the front surface 152 of the substrate 150 at the substrate periphery and a second seal 186 with the chuck body 140. The two seals 184 and 186 isolate the annular chamber 180 and the heat-transfer interface 166 from the remaining evacuatable space within the processing chamber (not shown). Some flexibility is provided between the seals 184 and 186 to accommodate thickness differences between substrates and dimensional tolerances of the chuck components. Flows of heat-transfer gas (or other fluid) can be delivered to or from the annular chamber through single-tube conduits 188 that connect the annular chamber 180 to a manifold 190. A line 192 connects the manifold 190 to a gas flow control device (not shown).

Pressures in the lines 174, 176, and 192 can be controlled to regulate not only pressures at the heat-transfer interface 166 and the annular chamber 180 but also the direction of flow through the periphery 178 of the heat-transfer interface 166. For example, the manifold 190 can be used as an outlet manifold for directing flows from the heat-transfer interface 166 to the annular chamber 180 or as an inlet manifold for directing flows from the annular chamber 180 to the heat-transfer interface 166.

The mechanical clamp 182 can be thermally coupled to the chuck body 140 to prevent excess substrate heating during plasma processing operations that transfer heat to the mechanical clamp 182. Most of the thermal transfer between the mechanical clamp 182 and the chuck body 140 takes place through a contiguous interface 196 that extends within the annular chamber 180 between the first and second seals 184 and 186. The mechanical clamp 182 is also preferably made of a heat-conducting material to also equalize temperatures throughout the rest of the clamp 182. It is also possible to make the clamp 182 from a thermal insulating or a low-thermal-conductive material.

The chuck 138 can also be adapted for use with various electric or magnetic field controls for further affecting substrate processing. For example, a plate-shaped electromagnet 194 is positioned next to the inlet manifold 168 to produce a uniaxial magnetic field in the vicinity of the substrate 150 for orienting domains of magnetic material on the substrate's front surface 152 during processing of magnetic materials.

Figure 8:
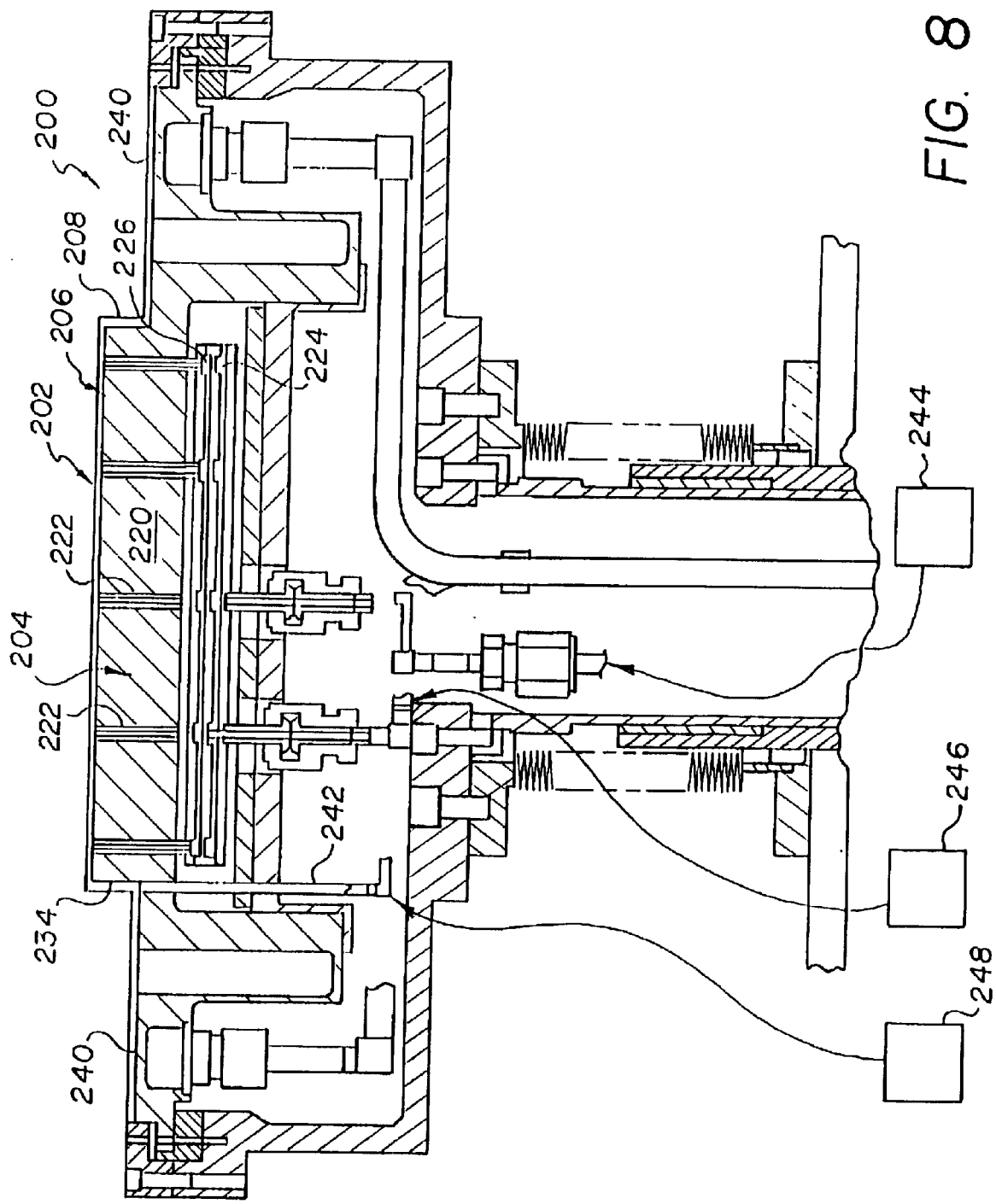
FIG. 8 is a cross-sectional view of another alternative chuck having an electrostatic clamp instead of a mechanical clamp for securing substrates.
Figure 9:
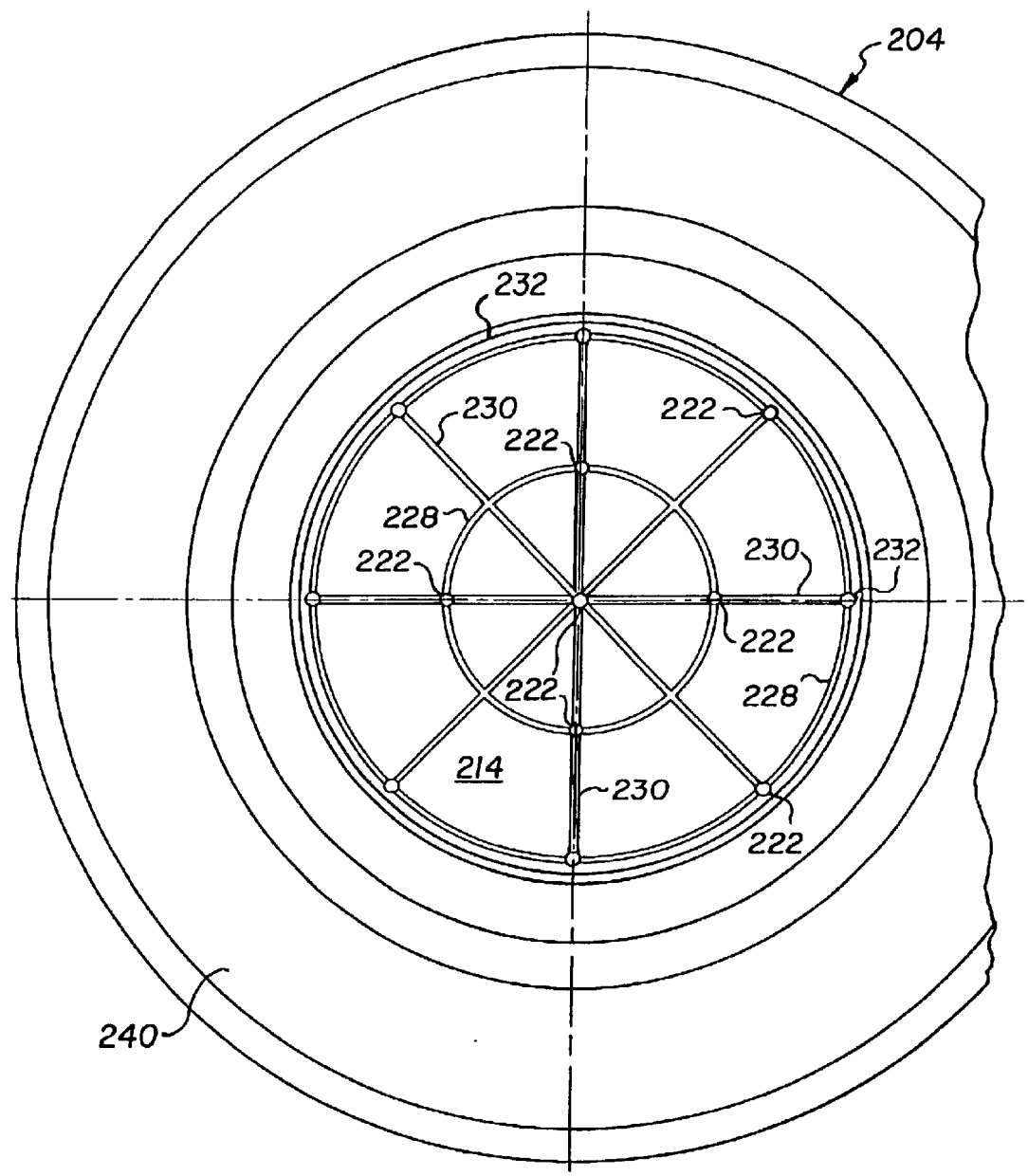
FIG. 9 is a top view of the chuck in FIG. 8 with the substrate removed to reveal surface channels that enable free flows of gas through the periphery of the substrate-chuck interface.
Figure 10:
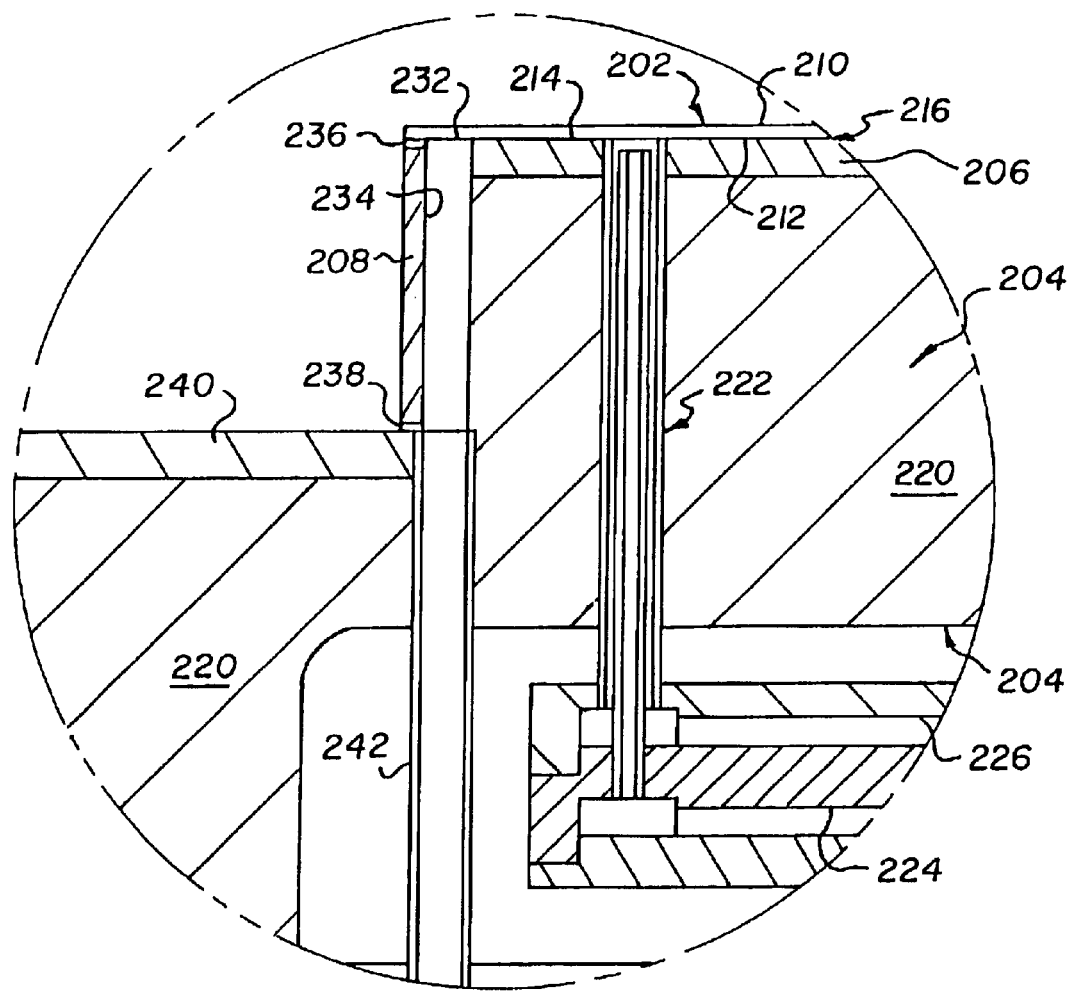
FIG. 10 is an enlarged partial view of FIG. 8 showing a region of engagement between the clamp, the substrate, and the chuck body and also showing inlet and outlet conduits for providing and collecting gas flowing through the substrate-chuck interface.

The next set of drawing figures, FIGS. 8–10, depict an alternative chuck 200, which uses a different means for mounting a substrate 202 on a chuck body 204 and for sealing a space between the substrate 202 and the chuck body 204. An electrostatic clamp 206 secures the substrate 202 to a central portion of the chuck body 204 and a separate peripheral support structure 208 seals a periphery of the substrate 202 to a surrounding portion of the chuck body 204.

The substrate 202 includes front and back surfaces 210 and 212. A mounting surface 214 of the electrostatic clamp 206 is substantially contiguous with a central portion of the substrate's back surface 212. The overlapping areas of the substrate's back surface 212 and the mounting surface 214 form a heat-transfer interface 216 for transferring heat between the substrate 202 and a heat-conducting portion 220 of the chuck body 204. The peripheral support 208, which is preferably spaced from the heat-conducting portion 220, engages an overhung area of the substrate's back surface 212 and does not contribute to active heating or cooling of the substrate 202.

Similar to the other embodiments, concentric conduits 222 convey gas between the heat-transfer interface 216 and inlet and outlet manifolds 224 and 226. Circumferential and radial grooves 228 and 230 formed in the mounting surface 214 provide for flowing the gas throughout the heat-transfer interface 216. The radial grooves 230 also extend through a periphery 232 of the heat-transfer interface 216 into an annular chamber 234 that surrounds the heat-transfer interface 216.

The annular chamber 234 is bounded by the substrate 202, the chuck body 204, and the peripheral support structure 208, which functions as an intermediate sealing structure. A first seal 236 formed at a top rim of the peripheral support 208 joins the peripheral support 208 to the substrate's back surface 212 at a periphery of the substrate 202. A second seal 238 formed at a bottom rim of the peripheral support 208 joins the peripheral support 208 to a non-conducting (extended or thermally isolated) portion 240 of the chuck body 204.

In comparison to the intermediate sealing structure of the immediately preceding embodiment, the peripheral support 208 is thermally isolated from the heat-conducting portion 220 of the chuck body 204 and does not contribute to the active heating or cooling of the substrate. Features that contribute to the thermal isolation include the physical spacing of the peripheral support 208 from the heat-conducting portion 220 of the chuck body 204 and the non-conducting (extended or thermally isolated) portion 240 of the chuck body 204 that separates the second seal 238 from the heat-conducting portion 220. The peripheral support 208 can also be made of a non-conducting material, such as ceramic, or a thin-walled metallic enclosure for further isolating the first seal 236.

The annular chamber 234 itself functions as a gas manifold so that only a single conduit 242 is needed to regulate flows to and from the annular chamber 234. The inlet and outlet manifolds 224 and 226, as well as the single conduit 242 from the annular chamber 234, are connected to separate flow controls 244, 246, and 248. Similar to the other embodiments, flows between the annular chamber 234 and the heat-transfer interface 216 are controlled by the separate flow controls 244, 246, and 248. Also similar to the other embodiments, the concentric and single-tube conduits can be used in place of each other as long as the desired flow requirements are met.

The electrostatic clamp 206, which is made from layers of patterned electrically conductive and blanket non-conductive materials, is preferably joined to the chuck body 204 by a bonding or brazing process. Both are preferably thermally conductive to minimize any resistance to heat transfers between the heat-conducting portion 220 and the substrate 202. An attractive force exerted by the electrostatic clamp 206 presses the substrate 202 onto the chuck body 204. However, just prior to contacting the chuck body 204, the substrate 202 contacts the peripheral support 208 for engaging the first seal 236. Preferably, either the substrate 202 or one of the first and second seals 236 or 238 is sufficiently flexible to permit the central portion of the substrate's back surface 212 to contact the mounting surface 214 of the chuck body 204.

Figure 11:
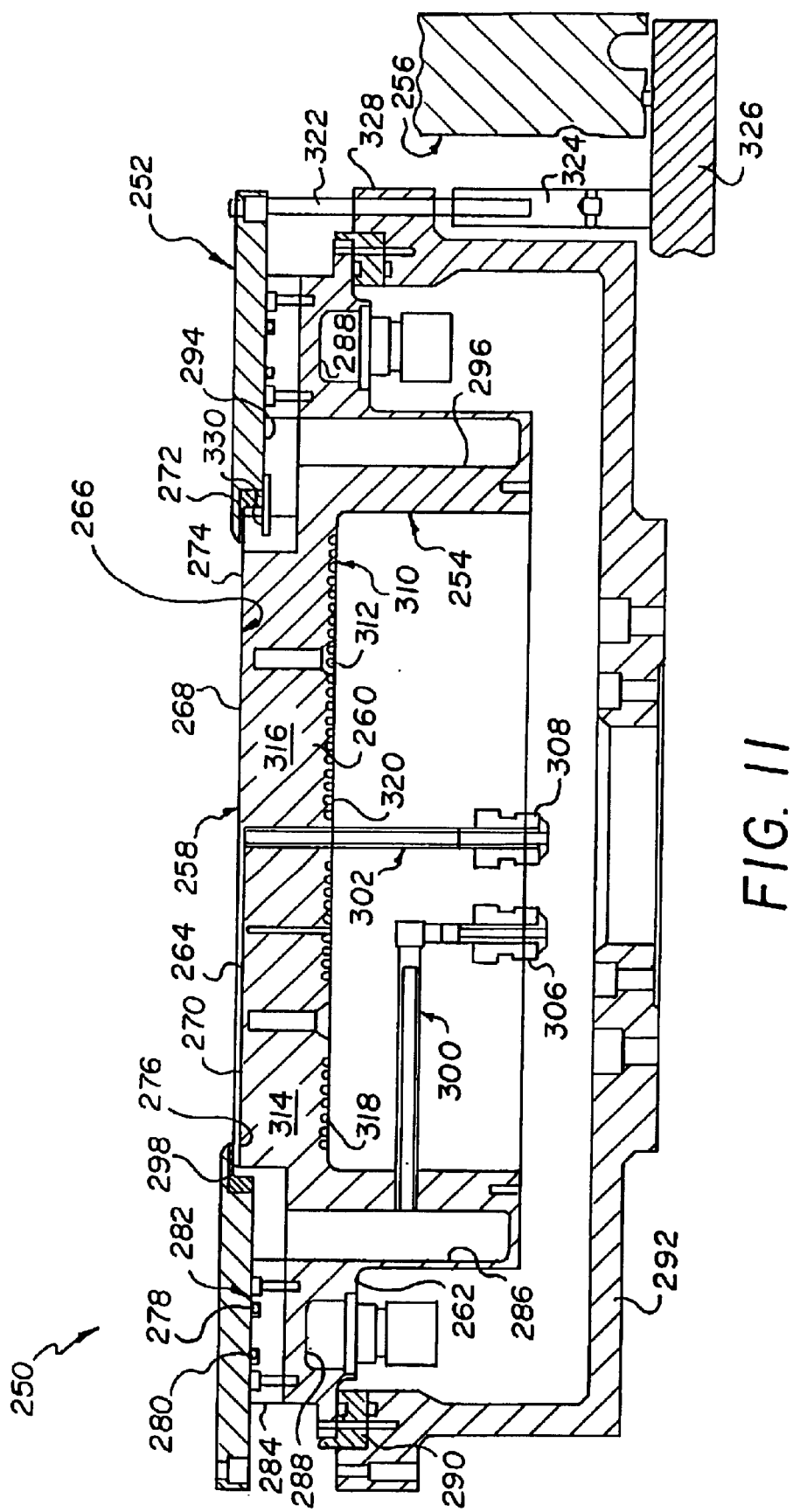
FIG. 11 is a cross-sectional view of an alternative chuck particularly suited for fabricating semiconductor wafer substrates with a multi-zone heating unit and a mechanical clamp that forms a first seal with the substrate and a second seal with an extended portion of the chuck body.

Drawing figure FIG. 11 depicts a chuck 250 having a different sealing arrangement between a mechanical clamp 252 and a chuck body 254 within a vacuum processing chamber 256. The chuck 250 is particularly arranged for processing semiconductor wafers. A substrate 258, such as a semiconductor wafer, is mounted on an heat-conducting portion 260 of the chuck body 254, and the mechanical clamp 252 seals the substrate 258 to a thermally isolated portion 262 of the chuck body 254.

A mounting surface 264 of the chuck body 254 engages and is thermally coupled to a back surface 266 of the substrate 258, forming between them a heat-transfer interface 268. Similar to earlier embodiments, a star-burst pattern of channels 270 (i.e., a combination of radial and circumferential channels) is formed in the mounting surface 264 for circulating or guiding heat-transfer gas (or other fluid) throughout and beyond the interface 268.

A thermally insulated portion 272 (e.g., ceramic) of the mechanical clamp 252 engages a front surface 274 of the substrate 258 at or near its periphery forming a first seal 276 with the substrate 258 and also engages a pair of compliant O-rings 278 and 280 forming a second seal 282 with the chuck body 254. The compliant O-rings 278 and 280, which are preferably made from an elastomeric material, provide the required flexibility for clamping and sealing substrates having a range of different thicknesses to the chuck body 254. Dimensional tolerances of the chuck can also be accommodated by the compliant O-rings 278 and 280. Sometimes, just one of the O-rings 278 and 280 may be needed to provide adequate sealing. The region between the two O-rings 278 and 280 can be pumped out to further reduce leakage into the main processing chamber 256.

Thermal protection for the O-rings 278 and 280 takes several forms. An O-ring support ring 284, which can also be made of a ceramic material, supports the O-rings 278 and 280 on the thermally isolated portion 262 of the chuck body 254. The thermally isolated portion 262 is isolated from the heat-conducting and temperature-regulated portion 260 of the chuck body 254 by a thin-walled trough 286. In addition, an annular coolant channel 288 of a conventional coolant system (not shown) extends through the thermally isolated portion 262 for extracting unwanted heat before the heat can reach the O-rings 278 and 280. Another annular seal 290, which connects the thermally isolated portion 262 of the chuck body 254 to an axially translatable housing 292 of the chuck body 254, is similarly protected by the coolant channel 288 in the thermally isolated portion 262 of the chuck body. Alternatively, the O-ring support ring can be made as an integral part of the thermally isolated portion 260 of the chuck body 254.

The substrate 258, the mechanical clamp 252, the O-rings 278 and 280, the insulating ring 284, and the chuck body 252 form an annular chamber 294 that surrounds the heat-transfer interface 268 between the substrate 258 and the chuck body 254. The annular chamber 294 and the heat-transfer interface 268 form a separately pressurizable region within the vacuum chamber 256.

A portion of the annular chamber 294, which is shaped largely by the thin-walled trough 286, functions as an inlet manifold 296 for uniformly distributing heat-transfer gas around a periphery 298 of the heat-transfer interface 268. A single inlet conduit 300 supplies heat-transfer gas to the inlet manifold 296, and a single outlet conduit 302 extends through a center of the mounting surface 264 for exhausting heat-transfer gas from the heat-transfer interface 268. (Although the single outlet conduit 302 is shown in its preferred center position, outlet conduits can extend anywhere through the mounting surface 264 under the substrate 258.) The channels 270 formed in the mounting surface 264 extend through the periphery 298 of the heat-transfer interface 268 to permit a free flow of gas between the heat-transfer interface 268 and the annular chamber 294. Fluid (gas) couplings 306 and 308 connect the inlet and outlet conduits 300 and 302 to flow controls (not shown) similar to the other embodiments.

A direction of flow, which preferably extends from the annular chamber 294 to the heat-transfer interface 268, can be reversed by reversing the functions of the inlet and outlet conduits 300 and 302. The location, size, and number of the inlet and outlet conduits 300 and 302 as well as the channels 270 in the mounting surface 264 can be chosen to control flow patterns throughout the heat-transfer interface 268.

A multi-zone heater 310 provides further control over temperature variations within the heat-transfer interface 268. The heat-conducting portion 260 of the chuck body 254, which is preferably made of a high-thermal-conductive material such as aluminum or copper or another suitable metallic material such as stainless steel, is interrupted by a zone isolation groove that is filled with an isolation ring 312 made from a low-thermal-conductive material, such as ceramic, or is just left as an empty groove for separating the heat-conducting portion 260 into different heating zones 314 and 316. Separately controlled coils 318 and 320 regulate temperatures between the different zones 314 and 316 in order to establish a more uniform substrate temperature distribution. Although depicted with just two zones 314 and 316, the heat-conducting portion 260 of the chuck body 254 could be divided into three or more zones for further controlling the substrate temperature distribution.

The mechanical clamp 252 is secured to pins 322 that are translatable along vertical guides 324 projecting from a bottom wall 326 of the vacuum chamber 256. The chuck housing 292 also contains vertical guides 328 engaging the same pins 322 for translating the chuck body 254 into engagements with the substrate 258 and the mechanical clamp 252. The vertical guides 324 of the pins 322 permit the chuck body 254, the substrate 258, and the mechanical clamp 252 to translate together into a desired processing position within the chamber 256. Ledges 330 extending from a bottom of the mechanical clamp 252 support the substrate 258 above the chuck body 254 for loading and unloading the substrate 258 to and from the processing chamber 256 during substrate handling cycles.

FIGS. 12–15 depict a chuck 350 that embodies yet another of the types of substrate mounting and gas sealing arrangements made possible by this invention. The chuck 350 is particularly suitable for making data storage thin-film heads. A substrate 352 is mounted on a slotted rim 354 (shown best in FIG. 15) that projects from a mounting surface 356 of a chuck body 358. The slotted rim 354 provides a peripheral support for the substrate 352, and the remaining mounting surface 356 forms together with a back surface 360 of the substrate 352 a heat-transfer interface 362 between the substrate 352 and the chuck body 358.

In place of channels formed in the mounting surface 356, the slotted rim 354 supporting the substrate 352 provides a space between the mounting surface 356 and the back surface 360 of the substrate 352 within which heat-transfer gas can circulate (flow) throughout the heat-transfer interface 362. Spacings between the back surface 360 of the substrate 352 and the mounting surface 356 of a chuck body 358 in a range of 0.05 mm to 0.025 mm are preferred. The slotted rim 354 is preferably formed integral with the chuck body 358 but can also be formed as a separate structure, such as a ceramic ring. Posts or other discontinuous supports can be used for mounting the substrate 352 in place of the slotted rim 354.

The chuck body 358 includes an assembly of plates 364–370. Heat-conducting plates 364 and 366, which are preferably made of copper or aluminum, are machined to provide space for conduits 372 that circulate coolant (e.g., air at pressures over approximately 200 kPa, 30 psi) throughout the chuck body 358 as well as for inlet and outlet conduits 374 and 376 that convey a heat-transfer gas (fluid) to and from the heat-transfer interface 362. The heat-conducting plate 366 also supports a heating unit 378. Insulating plate 368, which is preferably made of ceramic, thermally isolates cooled plate 370 from the heating unit 378. The cooled plate 370 is sealed to a surrounding chuck housing 380 that is translatable within a vacuum processing chamber 382. An electromagnet 384 is encased within the chuck housing 380 to prevent out-gassing into the processing chamber 382.

A mechanical clamp 386, which is also machined to accommodate some of the coolant conduits 372, forms a first seal 388 with a front surface 390 of the substrate 352 and a second seal 392 with an extension of the chuck body 358. The second seal 392 includes a pair of compliant O-rings 394 and 396 mounted on an O-ring support ring 398 that is attached to the cooled plate 370. A coolant channel 400 formed between the O-ring support ring 398 and the cooled plate 370 further protects the O-rings 394 and 396 from overheating. The coolant conduits 372 that are partly encased by the mechanical clamp 386 can be independently controlled to also prevent heat from reaching the O-rings 394 and 396 through the mechanical clamp 386. However, the main purpose of the coolant conduits 372 is to provide a rapid substrate cool-down capability using a flow of pressurized air.

The mechanical clamp 386 and its two seals 388 and 392 with the substrate 352 and the chuck body 358 confines a space 402 surrounding the heat-transfer interface. Within the space 402 is an inlet manifold 404 (shown best in FIG. 15) that is formed in the heat-conducting plate 364 of the chuck body 358. The inlet conduit 374 conveys heat-transfer gas directly into the inlet manifold 404, which circulates (flows) the gas around an entire periphery 406 of the heat-transfer interface 362. The outlet conduit 376 exhausts the heat-transfer gas directly from the heat-transfer interface 362. The slotted rim 354 permits a free flow (exchange) of gas between the inlet manifold 404 and the heat-transfer interface 362 to complete a path of circulation (gas flow) from the inlet conduit 374 to the outlet conduit 376.

Figure 13:
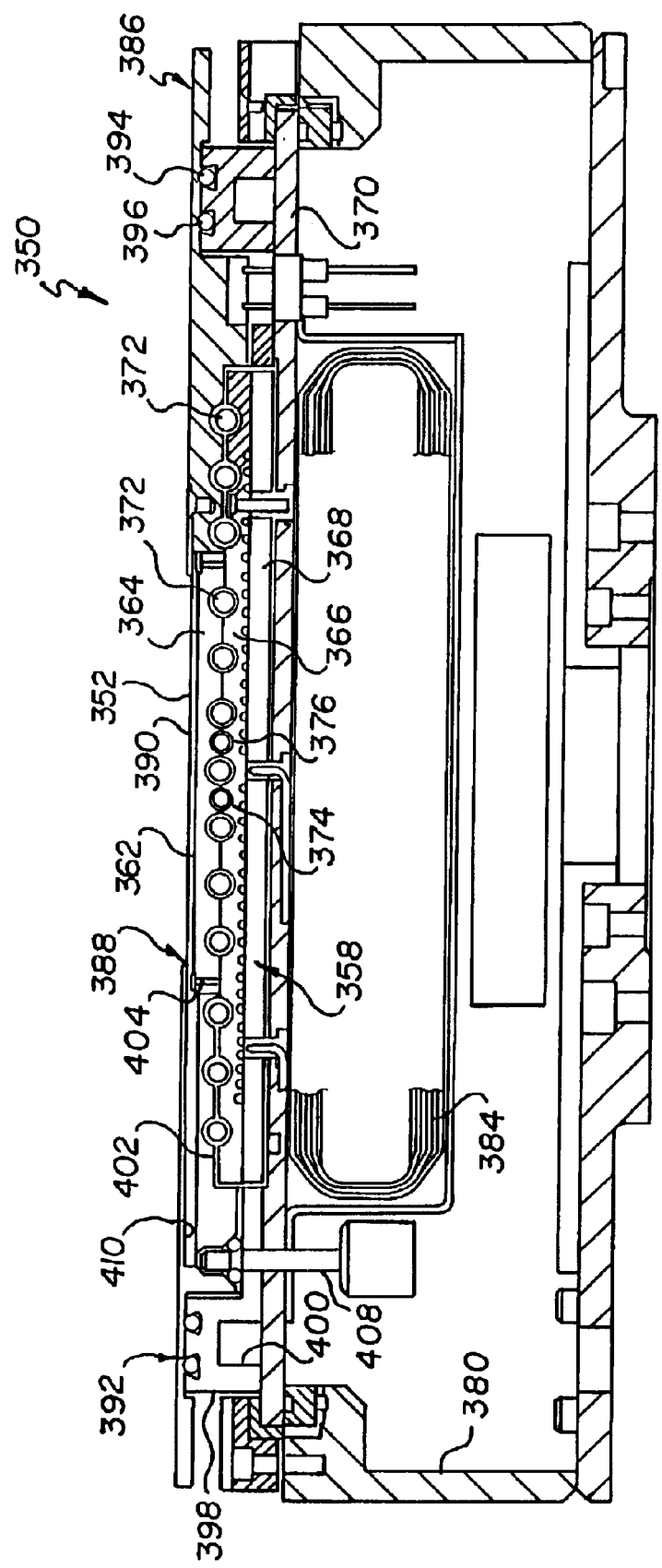
FIG. 13 is a second cross-sectional view of the chuck of FIG. 12 showing conduits of the cooling unit as well as inlet and outlet conduits for conveying gas to and from the substrate-chuck interface.
Figure 15:
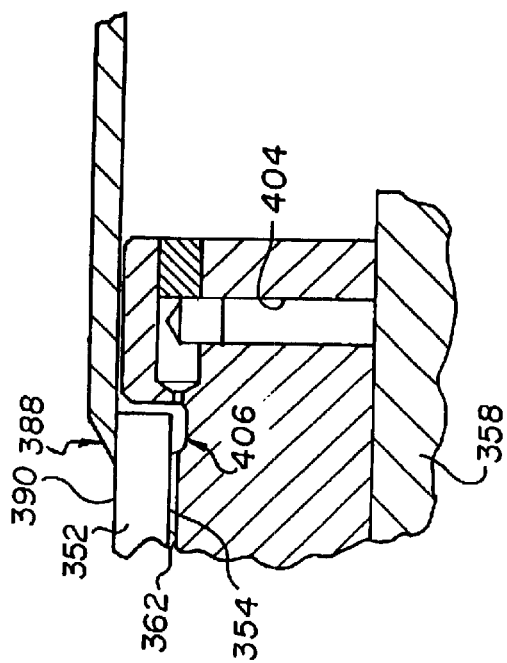
FIG. 15 is an enlarged cross-sectional view of the inlet manifold in the chuck body.
Figure 14:
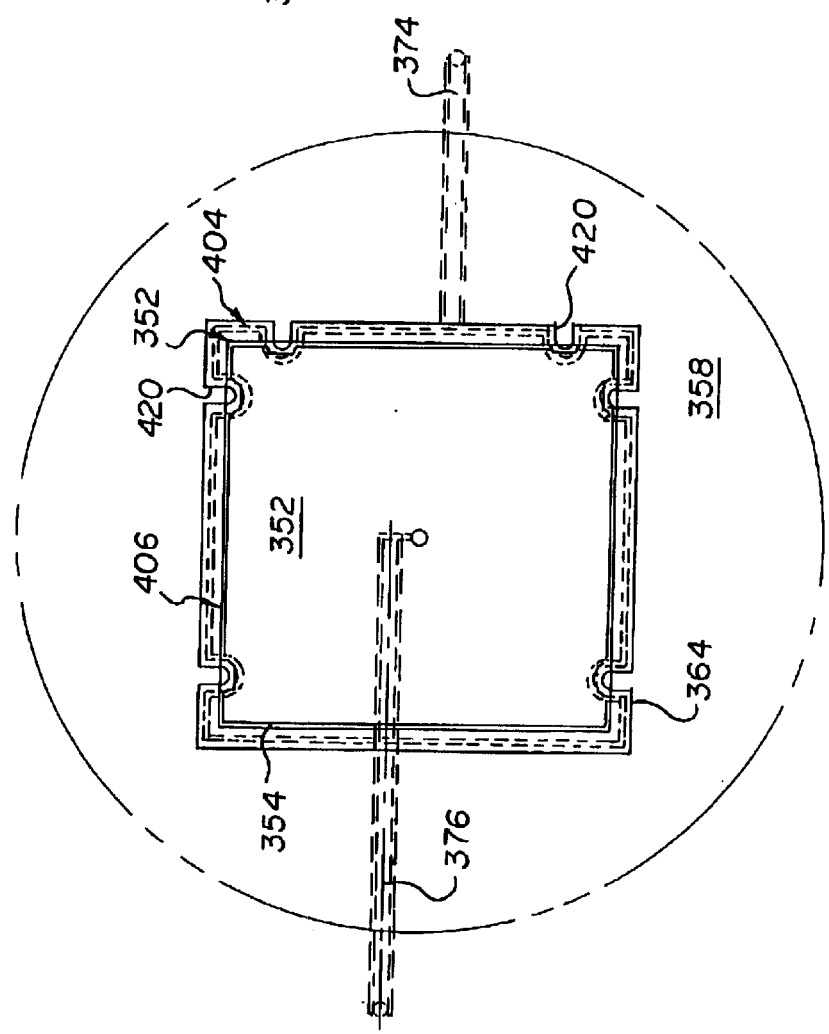
FIG. 14 is a top view of the same chuck showing the substrate and a portion of the chuck body with the mechanical clamp removed. The view best illustrates an inlet manifold in the chuck body that surrounds a periphery of the substrate.

Of course, the direction of flow can easily be reversed by exchanging the functions of the inlet and outlet conduits 374 and 376. FIG. 13 also shows an alternative inlet conduit 408 that includes a passageway 410 through the mechanical clamp 386 to the inlet manifold 404. Also, a fluid conduit 412 between the two O-rings 394 and 396 can be used as a differential pump-out to remove any gas that may have leaked past the innermost O-ring 394 to minimize leakage of gas into the processing chamber.

Figure 12:
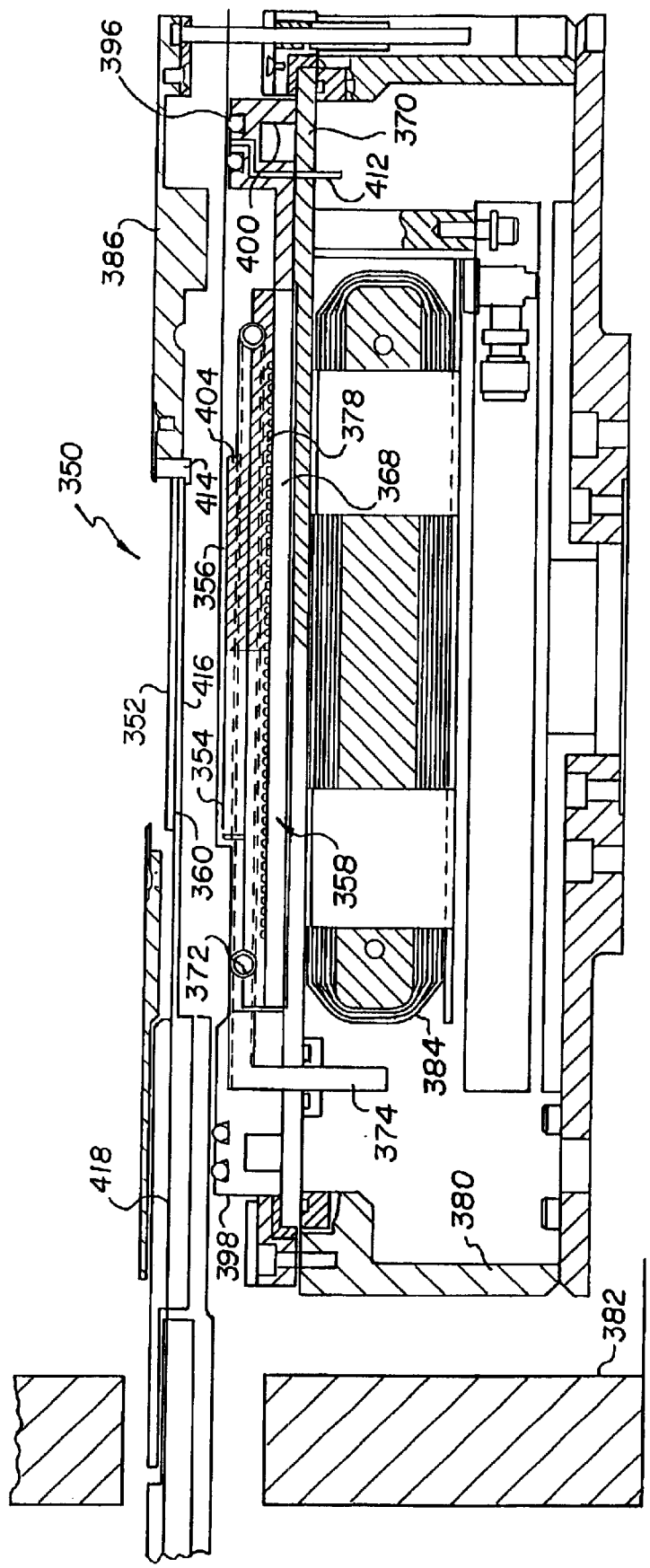
FIG. 12 is a first cross-sectional view of an alternative chuck particularly suited for fabricating data storage head substrates with combined heating and cooling units, an electromagnet, and a mechanical clamp that encloses some of the cooling unit. The mechanical clamp also functions as an intermediate sealing structure between the substrate and the chuck body.

FIGS. 12 and 13 also contrast lowered and raised positions of the chuck body 358, corresponding to wafer handling and processing modes of operation. When lowered, the substrate 352 is supported on ledges 414 of the mechanical clamp 386 with sufficient clearance to permit an end effector 416 of a robot arm 418 to load the substrate 352 into the processing chamber 382 or to remove the substrate 352 from the processing chamber 382. U-shaped recesses 420 (see FIG. 14) in the chuck body 358 provide clearance for the ledges 414 while the mechanical clamp 386 is engaged with the chuck body 358 and the substrate 352.

Figure 16A:
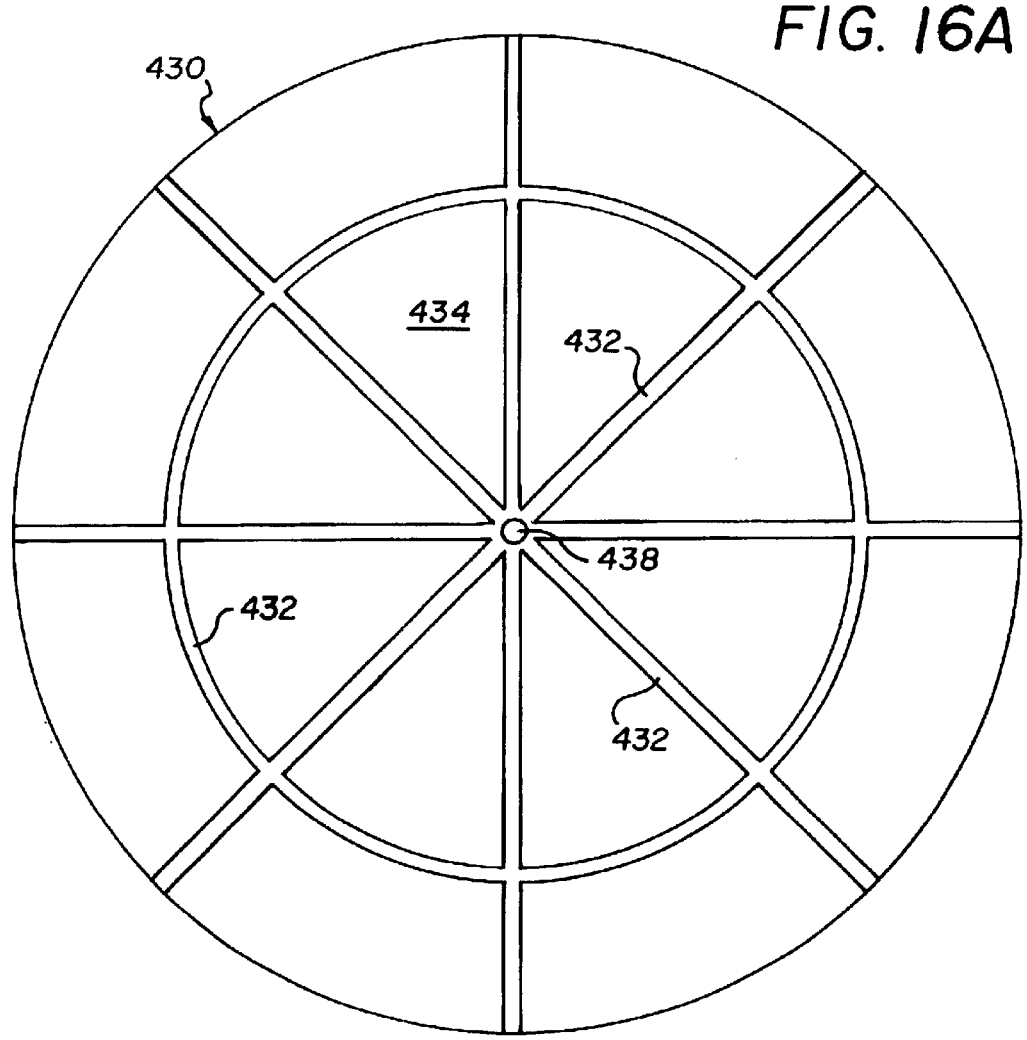
FIGS. 16A and 16B are top and side schematic views of a substrate-chuck interface in which a star-burst pattern of channels is formed in a mounting surface of a chuck body to enable a free flow of gas through a periphery of the substrate-chuck interface.
Figure 16B:
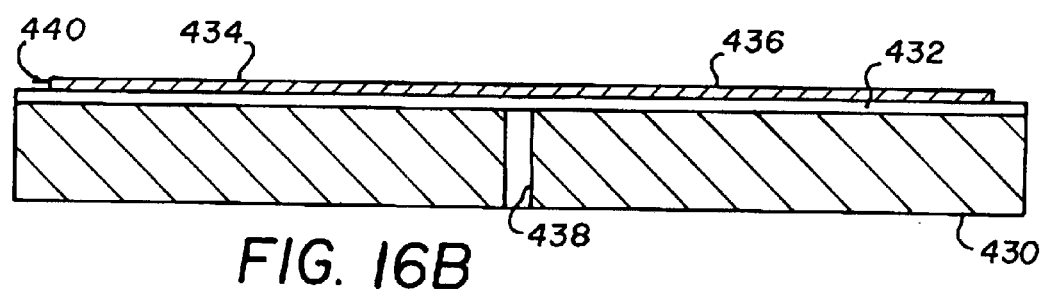

FIGS. 16A–18B show alternative chuck surface structures for supporting substrates without blocking free flows of heat-transfer gas beyond a periphery of the supports. For example, FIGS. 16A and 16B shown a chuck body 430 having a star-burst pattern of channels 432 formed in a mounting surface 434 for a substrate 436. The channels 432 converge at the center of the mounting surface 434 to an inlet/outlet conduit 438 and extend beyond a periphery 440 of the substrate 436 for promoting a free flow of gas through this region. Other continuous or discontinuous patterns of channels 432 can also be used to affect distributions of gas between the substrate 436 and the mounting surface 434.

Figure 17A:
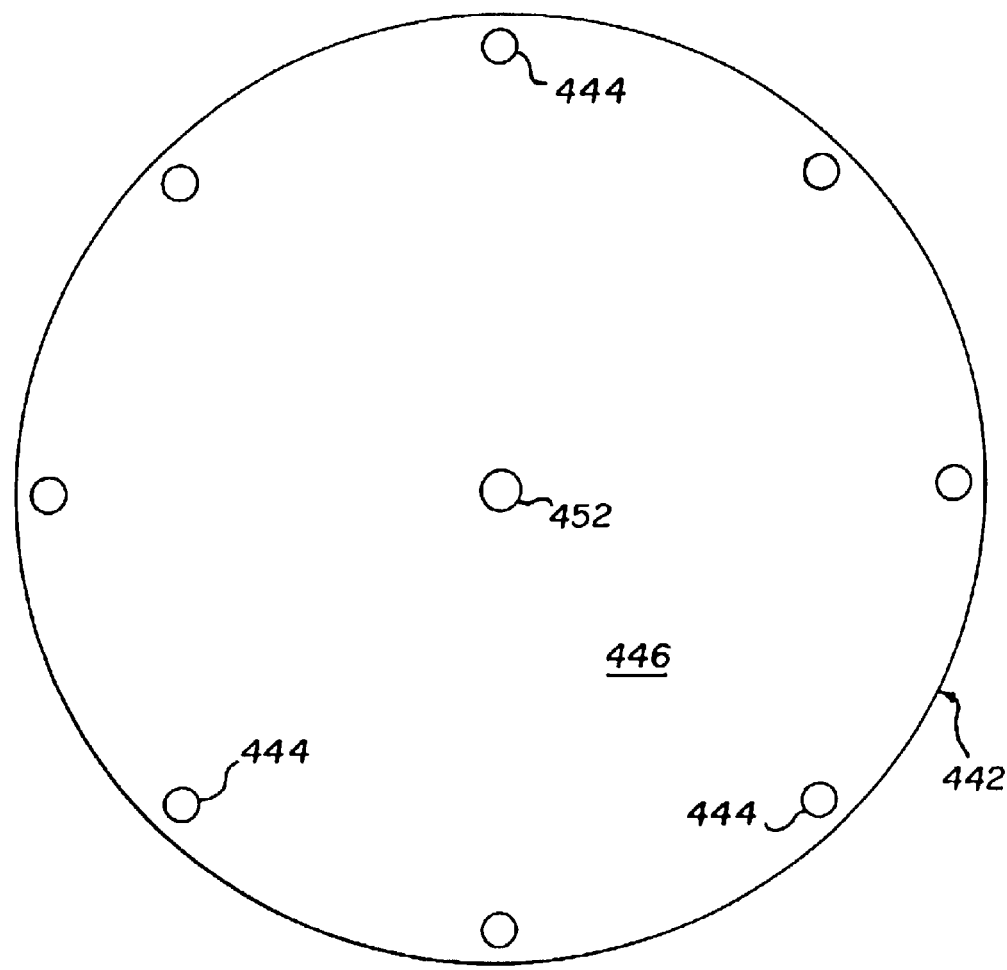
FIGS. 17A and 17B are top and side schematic views of another substrate-chuck interface in which an array of posts project from a mounting surface of the chuck into contact with a back side of the substrate to provide clearance for a similar free flow of gas.
Figure 17B:
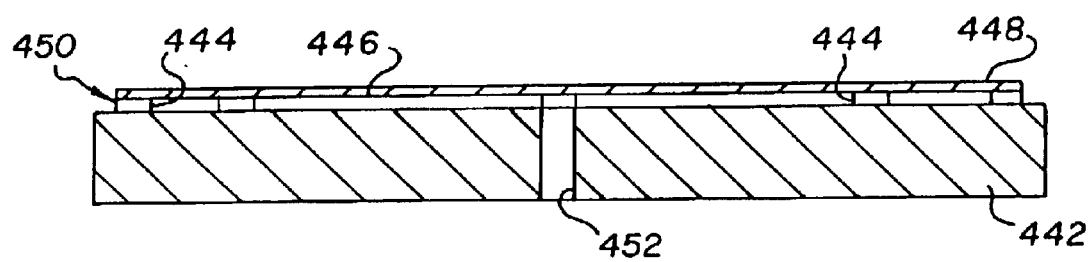

FIGS. 17A and 17B depict a chuck body 442 having support posts 444 that project above a mounting surface 446 for supporting a substrate 448. The posts 444 provide clearance between the substrate 448 and the mounting surface 446 to permit free flows of gas from beyond a periphery 450 of the substrate to the inlet/outlet conduit 452. Although the posts 444 are preferably positioned near the periphery 450 of the substrate 448 to oppose any bending moment imparted by a mechanical clamp, the size, number, and positions of the posts 444 can be changed to provide different support for the substrate 448. Preferably, the posts 444 are formed integral with the mounting surface 446 and project between 0.1 mm and 0.25 mm above the rest of the mounting surface 446.

Figure 18A:
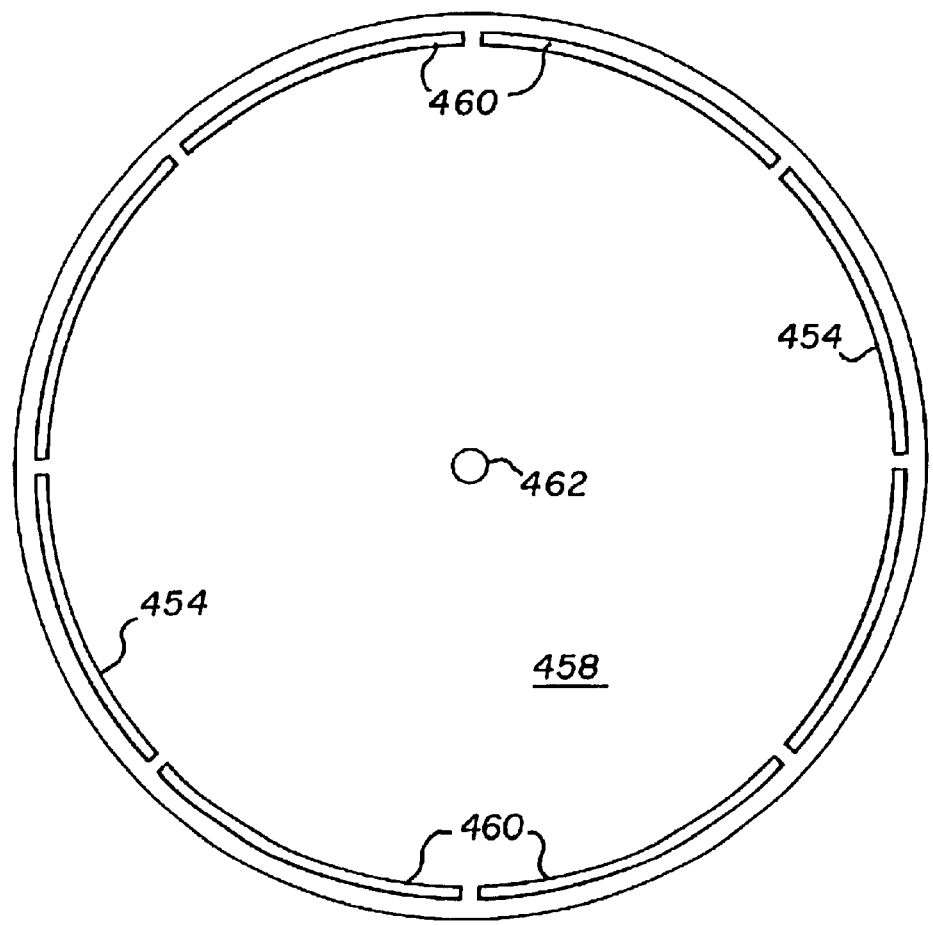
FIGS. 18A and 18B are top and side schematic views of yet another substrate-chuck interface in which a slotted rim replaces the posts for providing a clearance space for the flow of gas between the substrate and the chuck. Slots in the rim permit a free flow of gas through the periphery of the substrate-chuck interface.
Figure 18B:
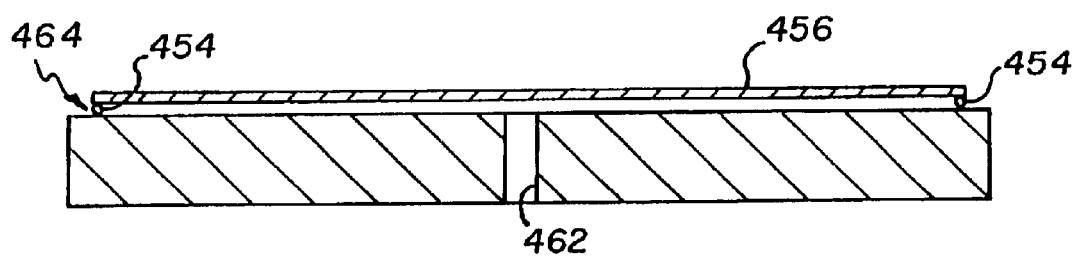

The drawing figures, FIGS. 18A and 18B, further illustrate use of a slotted rim 454 for supporting a substrate 456 above a chuck mounting surface 458. The resulting clearance together with the slots 460 permit a free flow of gas to an inlet/outlet conduit 462 from beyond a periphery 464 of the substrate 456. The size, number and distribution of the slots 460 can affect patterns of flow within the clearance space between the substrate 456 and the mounting surface 458. Additional slotted rings can also be used to adjust pressure or flow within the same clearance space.

Figure 19:
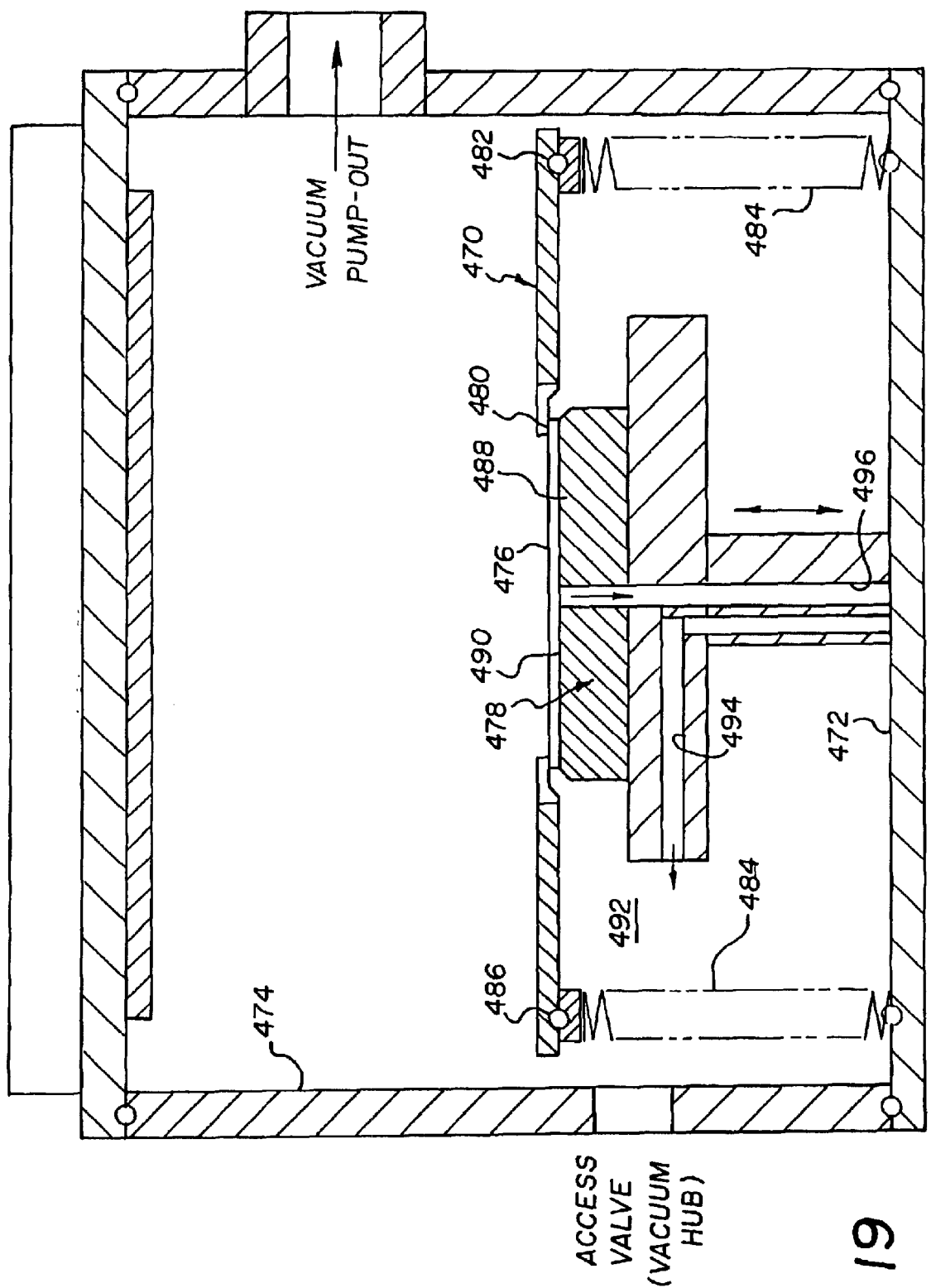
FIG. 19 is a schematic cross-sectional view of another vacuum processing chamber in which a substrate is mounted on a chuck that is adjustable in height within the processing chamber. Adjustable-height bellows support a mechanical clamp in the vacuum processing chamber to provide an alternative sealing structure between the substrate and the chuck.

The final drawing figure, FIG. 19, illustrates how a clamp 470 (or other intermediate sealing structure) can be joined to a bottom wall 472 (or other wall) of a vacuum chamber 474 to provide a desired seal between a substrate 476 and chuck body 478. The clamp 470 forms a portion of a first seal 480 with the substrate 476 and a portion of a second seal 482 with an adjustable-height bellows 484 that extend from the bottom wall 472. An elastomeric O-ring seal 486 can be used to complete the seal between the clamp 470 and the bellows 484.

The substrate 476 is mounted on a temperature-regulated portion 488 of the chuck body 478, forming between them a heat-transfer interface 490 similar to one of the embodiments of FIGS. 16A–18B. A chamber 492 bounded by the substrate 476, the clamp 470, the adjustable-height bellows 484, the bottom wall 472, and the chuck body 478 surrounds the heat-transfer interface 490. An inlet conduit 494 transports a heat-transfer gas to the chamber 492, and an outlet conduit 496 removes the heat-transfer gas from the heat-transfer interface 490. Of course, the functions of the inlet and outlet conduits 494 and 496 can be easily reversed to promote exchanges of gas in either direction between the heat-transfer interface 490 and the surrounding chamber 492.

I claim:

1. A thermally conductive chuck for supporting a substrate in a processing chamber comprising:

a temperature-regulated chuck body having a mounting surface for supporting the substrate within an evacuated space of the processing chamber;

said mounting surface forming a portion of a heat-transfer interface with the substrate, the heat-transfer interface extending to a periphery of the substrate for conveying heat between said temperature-regulated chuck body and the substrate;

a mechanical clamp for securing the substrate to the mounting surface and having means for sealing said temperature-regulated chuck body to the substrate beyond the heat-transfer interface for confining a heat-transfer fluid within a separately pressurizable region of the evacuated space;

a first portion of the separately pressurizable region being defined between said mounting surface of the chuck body and the substrate;

a second portion of the separately pressurizable region being defined between said mechanical clamp and said chuck body as a chamber surrounding the first portion of the separately pressurizable region of the evacuated space;

the first and second portions of the separately pressurizable region being separated by the periphery of the substrate;

a passageway formed in the chuck body between the chuck body and the substrate that permits a substantially uninhibited flow of the heat-transfer fluid across the periphery of the substrate between the first and second portions of the separately pressurizable region;

inlet and outlet conduits, one of said inlet and outlet conduits being connected to the first portion of the separately pressurizable region and the other of said inlet and outlet conduits being connected to the second portion of the separately pressurizable region for supporting the flow of the heat-transfer fluid along the passageway between the first and second portions of the separately pressurizable region;

the second portion of the separately pressurizable region being bounded by said mechanical clamp, said chuck body, and the substrate;

the inlet conduit being connected to the second portion of the separately pressurizable region and the outlet conduit being connected to the first portion of the separately pressurizable region for supporting flow of the heat-transfer fluid across the periphery of the substrate from the second portion of the separately pressurizable region to the first portion of the separately pressurizable region; and a flow control system connected to said inlet and outlet conduits and being arranged for regulating flows of the fluid through the separately pressurizable region in a direction from the second portion to the first portion of the separately pressurizable region.

2. A thermally conductive chuck for supporting a substrate in a low-pressure processing environment comprising:

a chuck body having a mounting surface for supporting the substrate within the low-pressure processing environment;

said mounting surface being positioned for forming together with the substrate a heat-transfer interface having a periphery corresponding to a periphery of the substrate and surrounding a central portion of the substrate;

a mechanical clamp for securing the substrate to the mounting surface and having means for sealing the chuck body to the substrate;

said mechanical clamp forming together with said chuck body and the substrate a separately pressurizable region within the low-pressure processing environment for sustaining an elevated fluid pressure at the heat-transfer interface;

a passageway formed in the chuck body between the chuck body and the substrate that permits a substantially uninhibited flow of a heat-transfer fluid through the periphery of the heat-transfer interface;

inlet and outlet conduits straddling the periphery of the heat-transfer interface within the separately pressurizable region for supporting the flow of heat-transfer fluid along the passageway through the periphery of the heat-transfer interface;

said inlet and outlet conduits promote flows of fluid between first and second portions of said separately pressurizable region, the first portion of the separately pressurizable region being formed between the chuck body and the substrate, the second portion of the separately pressurizable region being formed between the chuck body and the mechanical clamp, and said first and second portions of the separately pressurizable region being separated by the periphery of the heat-transfer interface;

said outlet conduit being connected to said first portion of the separately pressurizable region, and said inlet conduit being connected to said second portion of the separately pressurizable region in support of flows of fluid through the periphery of the heat-transfer interface from said second portion of the separately pressurizable region to said first portion of the separately pressurizable region; and a flow control system connected to said inlet and outlet conduits and arranged for directing flows of the heat-transfer fluid along the passageway through the periphery of the heat-transfer interface in a direction from the second portion to the first portion of the separately pressurizable region.

3. A heat-transfer apparatus for regulating the temperature of a substrate within a low-pressure processing environment comprising:

a temperature-regulated body that forms together with the substrate a heat-transfer interface having a periphery corresponding to a periphery of the substrate;

a mechanical clamp that secures the substrate to the temperature-regulated body and that forms at least a portion of a seal between said temperature-regulated body and the substrate beyond the heat-transfer interface for confining a heat-transfer fluid within a separately pressurizable region of the low-pressure processing environment encompassing the heat-transfer interface;

a passageway formed in the temperature-regulated body between the temperature-regulated body and the substrate that permits a substantially uninhibited flow of the heat-transfer fluid through the periphery of the heat-transfer interface;

inlet and outlet conduits straddling the periphery of the heat-transfer interface within the separately pressurizable region of the low-pressure processing environment for supporting the flow of heat-transfer fluid along the passageway formed through the periphery of the heat-transfer interface;

said inlet and outlet conduits promoting flows of fluid between first and second portions of the separately pressurizable region of the low-pressure processing environment, the first portion of the separately pressurizable region of the low-pressure processing environment being formed between the temperature-regulated body and the substrate, the second portion of the separately pressurizable region of the low-pressure processing environment being formed between the temperature-regulated body and the mechanical clamp, and said first and second portions of the separately pressurizable region of the low-pressure processing environment being separated by the periphery of the heat-transfer interface;

said outlet conduit being connected to said first portion of the separately pressurizable region and said inlet conduit being connected to said second portion of the separately pressurizable region in support of flows of fluid through the periphery of the heat-transfer interface from said second portion of the separately pressurizable region to said first portion of the separately pressurizable region; and a flow control system connected to said inlet and outlet conduits and arranged for directing flows of the heat-transfer fluid along the passageway through the periphery of the heat-transfer interface in a direction from the second portion to the first portion of the separately pressurizable region.

* * * * *